(12) United States Patent
Driesen et al.

(10) Patent No.: US 9,000,791 B2
(45) Date of Patent: Apr. 7, 2015

(54) VOLTAGE CLAMPING CIRCUIT AND USE THEREOF

(75) Inventors: Johan Driesen, Heverlee (BE); Jordi Everts, Kinrooi (BE); Ratmir Gelagaev, Genk (BE); Pieter Jacqmaer, Hasselt (BE); Jeroen Van den Keybus, Kessel-lo (BE)

(73) Assignees: Katholieke Universiteit Leuven, Leuven (BE); Triphase, Heverlee (BE)

( * ) Notice: Subject to any disclaimer, the term of this patent is extended or adjusted under 35 U.S.C. 154(b) by 263 days.

(21) Appl. No.: 13/695,506

(22) PCT Filed: Apr. 29, 2011

(86) PCT No.: PCT/EP2011/056888
§ 371 (c)(1),
(2), (4) Date: Oct. 31, 2012

(87) PCT Pub. No.: WO2011/135094
PCT Pub. Date: Nov. 3, 2011

(65) Prior Publication Data
US 2013/0049783 A1    Feb. 28, 2013

(30) Foreign Application Priority Data

Apr. 30, 2010 (GB) .................................. 1007225.4
Dec. 8, 2010 (GB) .................................. 1020747.0

(51) Int. Cl.
*G01R 31/02* (2006.01)
*H03K 5/08* (2006.01)
*G01R 31/26* (2014.01)

(52) U.S. Cl.
CPC .................................. *G01R 31/2621* (2013.01)

(58) Field of Classification Search
CPC .... G01R 31/26; G01R 31/36; G01R 31/2621; G01R 1/067; H02H 9/04
See application file for complete search history.

(56) References Cited

U.S. PATENT DOCUMENTS

| 5,552,746 A | 9/1996 | Danstrom |
| 5,777,502 A | 7/1998 | Chen et al. |
| 6,137,278 A * | 10/2000 | Koffler et al. ................. 323/313 |
| 7,532,445 B2 * | 5/2009 | Rana et al. ...................... 361/56 |
| 2008/0309355 A1 | 12/2008 | Nozaki et al. |

FOREIGN PATENT DOCUMENTS

WO    90/12324    10/1990

OTHER PUBLICATIONS

International Preliminary Report on Patentability and Written Opinion for PCT/EP2011/056888, Nov. 6, 2012 (5 pages).
International Search Report for PCT/EP2011/056888 dated Aug. 9, 2011 (2 pages).

* cited by examiner

Primary Examiner — Minh N Tang
(74) Attorney, Agent, or Firm — Bacon & Thomas, PLLC

(57) ABSTRACT

A voltage clamp circuit for reflecting a voltage at an input node includes a circuit for providing at least two currents at its output terminal, and at least two diodes each being connected to an output terminal of the circuit for providing at least two currents. The diodes also are connected to a line of a ground voltage and to the input node respectively. The circuit includes an alternative current path connected to an output terminal of the circuit for providing at least two currents and to a current sinking node. The voltage at the input node thus is reflected as the voltage between two output nodes when the voltage at the input node is lower than a clamping voltage and so that the voltage is fixed between the two output nodes to the clamping voltage when the voltage at the input node is higher than the clamping voltage.

19 Claims, 18 Drawing Sheets

--PRIOR ART--

US 9,000,791 B2

VOLTAGE CLAMPING CIRCUIT AND USE THEREOF

FIELD OF THE INVENTION

The present invention relates to a voltage clamp circuit, and to a semiconductor device, an overcurrent protection circuit, a voltage measurement probe, a voltage measurement device, and a semiconductor evaluation device respectively using the voltage clamp circuit. More particularly, the present invention relates to a voltage clamp circuit that reflects an input voltage across an electric component, e.g. a transistor (drain-to-source voltage), as a voltage between two output nodes when this voltage is lower than a clamping voltage and that fixes a voltage between the output nodes to a clamping voltage when the input voltage is higher than this clamping voltage, to a semiconductor device, an overcurrent protection circuit, a voltage measurement probe, a voltage measurement device, and a semiconductor evaluation device respectively using the voltage clamp circuit, and to corresponding methods.

BACKGROUND OF THE INVENTION

Recently, high breakdown voltage semiconductor switching elements such as field-effect transistors (FETs) and insulated gate bipolar transistors (IGBTs) have achieved high performance as the development of power electronics has advanced. In particular, since achieving low loss is the most important challenge, the on-resistance of the transistor, which is directly linked to loss of power, needs to be as low as possible. For this purpose, accurate measurement of the on-resistance is indispensable. Recent high breakdown voltage semiconductor switching elements frequently perform high-speed operations, and therefore only the on-resistance calculated from direct-current (DC) measurements is not sufficient as a guideline for the performance. Especially wide band-gap semiconductor switching elements (e.g. GaN devices) often are subjected to an increase of the on-resistance when high voltage swings are applied to the drain terminal of the semiconductor switching element. The on-resistance, that occurs when applying high-voltage swings to the drain terminal of the semiconductor switching element, is further referred to as the dynamic on-resistance. To provide an effective performance guideline during switching operation, the dynamic on-resistance is to be measured.

The dynamic on-resistance measurement, however, involves difficulties. That is, in a semiconductor switching element during the switching operation, the high voltage and low current state (during the off-state) repeatedly alternates with the low voltage and high current state (during the on-state). The measurement of the dynamic on-resistance is typically performed by observing waveforms using an oscilloscope to allow changes with time, from the high voltage and low current state (during the off-state) to the low voltage and high current state (during the on-state), to be followed.

In measurements of voltage waveforms with an oscilloscope, unless the voltage waveforms are within the same range both during the on-state and during the off-state, the characteristics of an amplifier inside the oscilloscope are distorted, resulting in failure to accurately measure the voltage waveforms. The voltage waveforms therefore need to be measured in a range wide enough for the high voltage during the off-state, that is, in most cases the power supply voltage. This, however, reduces the accuracy of the low voltage measurement, which is necessary for the measurement of the dynamic on-resistance. For example, in a case where the voltage during the on-state is 1 V and the power supply voltage is 100 V, an oscilloscope has to be set in a range not less than 100 V. In this case, even if the accuracy of a high-accuracy oscilloscope is 1% of the fill scale, the accuracy is 1 V with a voltage range of 100 V. The measured value is thus completely unreliable. To address this issue, a semiconductor evaluation device that can measure the voltage between two terminals of a semiconductor switching element in a low voltage range has been devised.

In US patent application, Pub. No.: US 2008/0309355 A1, such a semiconductor evaluation device is proposed. FIG. 13 is a circuit diagram showing the configuration of the semiconductor evaluation device of US 2008/0309355 A1. In the semiconductor evaluation device shown in FIG. 13, a source of semiconductor switching element (GaN-based field-effect transistor) 91 to be evaluated is grounded, a gate thereof is connected via a resistance element 93 to a pulse generating circuit 92, and a drain thereof is connected via a resistive element 96 and a current detector 95 to a DC power supply 94. The resistance value of load-resistance element 96 is, e.g., 1 kΩ and the output voltage of DC power supply 94 is, e.g., 100V.

The drain of semiconductor switching element 91 is connected via a voltage clamp circuit 97 to a first input terminal T1 of an oscilloscope 101, and a second input terminal T2 and a third input terminal T3 of oscilloscope 101 are connected to current detector 95 and the gate of semiconductor switching element 91, respectively.

Voltage clamp circuit 97 includes a normally-on type field-effect transistor 98, a resistance element 99 and a DC power supply 100 of which the output voltage can be adjusted. Field-effect transistor 98 has a negative threshold voltage (e.g. −2V), and a drain thereof is connected to an input node N98, a source thereof is connected to an output node N99, and a gate thereof receives the output voltage (e.g. 2V) of DC power supply 100. Resistance element 99 is connected between output node N99 and the line of a ground voltage GND. Input node N98 is connected to the drain of semiconductor switching element 91, and output node N99 is connected to first input terminal T1 of oscilloscope 101. The resistance value of resistance element 99 is, e.g., 20 kΩ.

Due to the normally-on type of field-effect transistor 98, when a current flows through resistance element 99, the voltage drop across resistance element 99 causes an increase of the voltage on the source side of field-effect transistor 98. At this point, when de difference voltage between the gate voltage (2 V) and source voltage $V_{out}$ of field-effect transistor 98 becomes lower than the threshold voltage (−2 V), field-effect transistor 98 is turned off, causing voltage $V_{out}$ at output node N99 to be clamped to the clamping voltage $V_c$=(−2 V)+2 V=4 V. Accordingly, voltage $V_{out}$ at output node N99 is limited to at most $V_c$, and therefore the range of the voltage at first input terminal T1 of oscilloscope 101 may be set to one wide enough for $V_c$.

FIG. 14 (part A) is a time chart showing a gate voltage $V_g$ of semiconductor switching element 91, and FIG. 14 (part B) is a time chart showing output voltage $V_{out}$ of voltage clamp circuit 97. Gate voltage $V_g$ is alternately switched between a low voltage $V_{goff}$ and a high voltage $V_{gon}$. When $V_g$ becomes $V_{goff}$, semiconductor switching element 91 is turned off, so that a drain voltage $V_{in}$ of semiconductor switching element 91 becomes approximately equal to the DC power supply voltage (100 V) while output voltage $V_{out}$ of clamping circuit 97 is fixed to clamping voltage $V_c$. When $V_g$ is raised from $V_{goff}$ to $V_{gon}$, semiconductor switching element 91 is turned on, so that the drain voltage $V_{in}$ abruptly drops, and when $V_{in}$ becomes not more than $V_c$, $V_{out}$=$V_{in}$. For example, if the measurement is performed in a voltage range of 4 V using oscilloscope 101, having a resolution of 10 bits, the measurement accuracy is 4/2^10=0.004 V, allowing a sufficiently accurate measurement of an on-state voltage of 1 V.

There also exists a semiconductor evaluation device (see FIG. 11) in which a voltage clamp circuit 76 includes a resistive element 77 connected between an input node N77 and an output node N78, and a diode 78 and a Zener diode 79 connected in series between the output node N78 and the line of a ground voltage GND. Accordingly, a voltage $V_{out}$ at the output node N78 is limited to at most a Zener voltage $V_z$ added by a forward voltage $V_d$ across diode 78, and therefore the range of an oscilloscope 80 may be set to one wide enough for $V_z+V_d$.

There also exists a semiconductor evaluation device in which a switch is connected between a semiconductor switching element and an oscilloscope. The voltage between terminals of the semiconductor switching element is compared with a reference voltage and the switch is turned on when the voltage between the terminals becomes lower than the reference voltage and is turned off when the voltage between the terminals becomes higher than the reference voltage (see, for example, Japanese Patent Laying-Open No. 2001-004670).

In voltage clamp circuit 97 (FIG. 13), however, if gate voltage $V_g$ (FIG. 14, part A) drops from high voltage $V_{gon}$ to low voltage $V_{goff}$ (time $t_2$), and thus the drain-voltage of semiconductor switching element 91 rises, output voltage $V_{out}$ (FIG. 14, part B) is increased above $V_c$ due to the parasitic drain-to-source capacitance of the normally-on type field-effect transistor 98 in combination with the relatively high value of resistance element 99. This peak voltage can be several times the clamping voltage $V_c$, distorting the characteristics of an amplifier inside the oscilloscope, resulting in failure to accurately measure the voltage waveforms. In addition, the rise of the output voltage $V_{out}$ will cause the gate-to-source voltage of the normally-on type field-effect transistor 98 to become more negative than allowed as the gate voltage is fixed to the DC voltage of DC voltage supply 100. This can destroy the normally-on type field-effect transistor 98. Also during the on-state of semiconductor switching element 91, a small current flows through the normally-on type field-effect transistor 98 causing a voltage drop across this transistor. This will introduce an error on the measurement. Another disadvantage is that fast high-voltage normally-on type field-effect transistors made of a wide band-gap semiconductor material are difficult to find.

In addition, in voltage clamp circuit 76 (FIG. 11) that includes a resistive element 77 connected between input node N77 and output node N78, and a diode 78 and a Zener diode 79 connected in series between the output node N78 and the line of ground voltage GND, there is a time delay problem. If gate voltage $V_g$ (FIG. 12A) is raised from low voltage $V_{goff}$ to high voltage $V_{gon}$ (time t1), output voltage $V_{out}$ (FIG. 12B) is gradually decreased to on-state voltage $V_{on}$ because of time delay due to the RC time constant caused by the resistive element 77 and the parasitic capacitance of diodes 78 and 79 and of the voltage probe which is typically connected to node N78, and time delay due to the recovery time (reverse recovery time) of the diodes 78 and 79. Thus, there has been a problem in that during high-speed operations in which the period of turning on and off of semiconductor switching element 70 is less than 1 microsecond, the characteristics of semiconductor switching element 70 cannot be accurately evaluated.

In addition, in a device that is switched on as the voltage between terminals of a semiconductor switching element becomes lower than a reference voltage, the response speed of the switch is several hundred nanoseconds. With this device, the characteristics of a semiconductor switching element have been unable to be accurately evaluated during high-speed operations in which the on/off period of the semiconductor switching element is less than 1 microsecond.

SUMMARY OF THE INVENTION

It is thus a principal goal of the present invention to provide a voltage clamp circuit having a high response speed, and a semiconductor device, an overcurrent protection circuit, a voltage measurement probe, a voltage measurement device, and a semiconductor evaluation device respectively using the voltage clamp circuit, as well as corresponding methods for voltage clamping.

It is an advantage of embodiments of the present invention that the proposed voltage clamp circuit does for example not affect the operation speed when used during switching transitions of a semiconductor element, allowing the voltage clamp circuit to operate at high speed.

It is an advantage of embodiments according to the present invention that the voltage clamp circuit inherently keeps current equilibrium.

It is an advantage of embodiments according to the present invention that using the voltage clamp circuit there is no delay caused by a RC time constant and there aren't any problems with parasitic coupling elements, keeping the voltage clearly within the desired range, for example even during state transitions of a semiconductor switching element to be characterised.

It is an advantage of embodiments according to the present invention that the components that are used for the voltage clamp circuit are easy to find and are used within their operating ranges.

The present invention relates to a voltage clamp circuit for reflecting a voltage at an input node, the voltage clamp circuit comprising a circuit for providing at least two currents at its output terminals, at least two diodes each being connected to an output terminal of the circuit for providing at least two currents and further being connected to a line of a ground voltage and the input node respectively, and an alternative current path connected to an output terminal of the circuit for providing at least two currents and to a current sinking node, so that the voltage at the input node is reflected as the voltage between two output nodes when the voltage at the input node is lower than a clamping voltage, e.g. using the at least two diodes, and so that the voltage is fixed between the two output nodes to the clamping voltage when the voltage at the input node is higher than the clamping voltage, e.g. using the alternative current path.

The circuit for providing at least two currents may be a current mirror circuit. The at least two diodes may be high-voltage diodes.

The circuit for providing two currents may be connected with a first output terminal to an anode of a first of the two high-voltage diodes and with a second output terminal to an anode of a second of the two high-voltage diodes, the first high-voltage diode having a cathode connected to a line of a ground voltage GND and an anode connected to the first output terminal of the circuit for providing two currents, and the second high-voltage diode having a cathode connected to the input node and an anode connected to the second output terminal of the circuit for providing two currents.

The alternative current path may be at one end connected to the output terminal of the circuit connecting one of the at least two diodes to the input node, and is at the other end connected to the current sink node.

The alternative current path may comprise or may be a series connection of one or more diodes, e.g. clamping diodes.

The series connection of one or more diodes may be a series connection of one or more diodes, e.g. clamping diodes, having a cathode connected to an anode of their neighbour and an anode connected to a cathode of their neighbour. An anode of a first diode of the series connection may be connected to an anode of one of the at least two diodes and a cathode of a last diode of the series connection may be connected to a current sinking node.

The clamping voltage may be a voltage of the sum of the forward voltage drops across the in series connected diodes when they are in conduction mode, e.g. the forward voltage drop across the series connection of diodes, added by a voltage of the sinking node minus the forward voltage drop across a first diode of the at least two diodes during the conduction mode of the diodes in the series connection.

One or more of the diodes of the series connection of clamping diodes may be Zener diodes, and wherein the Zener diodes are reversely placed.

The circuit for providing two currents may comprise a direct-current power supply, wherein the direct-current power supply may include a positive terminal connected to input terminals, e.g. positive input terminals, of the current mirror circuit and a negative terminal connected to the line of ground voltage, the current mirror circuit being connected with its input terminals, e.g. positive input terminals, to the positive terminal of the direct-current power supply.

The current sinking node may be the anode of a first diode of the two diodes and, during a conduction mode of the alternative current path, e.g. a conduction mode of the clamping diodes, the voltage of the sinking node may be the forward voltage drop across the first diode.

The current sinking node may be the line of ground voltage GND and the voltage of the sinking node may be zero.

The current mirror circuit may provide two equal currents at its output terminals.

The at least two diodes may have a low parasitic capacitance and low reverse recovery current.

The forward voltage drops across the at least two diodes may be as equal as possible, e.g. within 5%, or e.g. within 1%, when the at least two diodes carry equal currents.

The clamping diodes may have a low parasitic capacitance and low reverse recovery current.

All or some of the diodes may be transistors, used as diodes.

A current injection circuit may be added for injecting a current in the positive output node when the voltage at the input node drops from a high voltage to a low voltage.

The present invention also relates to a semiconductor device comprising the voltage clamp circuit as described above and a semiconductor switching element, wherein the input node is provided with a voltage between terminals of the semiconductor switching element. The semiconductor switching element may be formed of a wide band-gap semiconductor.

The present invention also relates to an overcurrent protection circuit comprising the voltage clamp circuit as described above, wherein the input node is provided with a voltage between terminals of a semiconductor switching element to be protected, and the overcurrent protection circuit further comprises a controller and a driver that turn off the semiconductor switching element when the voltage between the output nodes exceeds a predetermined voltage.

The present invention further relates to a voltage measurement probe comprising the voltage clamp circuit as described above, and a probe head in contact with a measurement point and electrically connected to the input node.

The present invention also relates to a voltage measurement device comprising the voltage clamp circuit as described above, wherein a voltage at a measurement point that is connected with the input node is measured from the output nodes.

The present invention further relates to a semiconductor evaluation device comprising the voltage measurement device as described above, a direct-current power supply for providing a direct-current voltage between terminals of a semiconductor switching element to be evaluated, and a pulse generating circuit turning on and off the semiconductor switching element, wherein the voltage measurement device is adapted for measuring, from the output nodes, a voltage between terminals of the semiconductor switching element provided to the input node.

The present invention also relates to the use of a voltage clamp circuit as described above in a semiconductor device, for overcurrent protecting, for voltage measuring or for evaluating a semiconductor device.

In a voltage clamp circuit according to another aspect of the present invention, two high-voltage diodes, a current mirror circuit, a direct-current power supply, and a series connection of clamping diodes are provided. The first high voltage diode includes a cathode connected to the line of ground voltage and an anode connected to the first output terminal of the current mirror circuit. The second high voltage diode includes a cathode connected to the input node and an anode connected to the second output terminal of the current mirror circuit. The direct current power supply is connected between the line of ground voltage and the input terminal(s) of the current mirror circuit. The series connection of clamping diodes is connected between the anode of the second high-voltage diode and a current sinking node, where the cathode of the last clamping diode is connected to the current sinking node and the anode of the first clamping diode is connected to the anode of the second high-voltage diode. What the current sinking node is, will be explained in detail further on. The anodes of the two high-voltage diodes form the output nodes, where the positive output node is the node at the anode of the second high-voltage diode and the negative output node is the node at the anode of the first high-voltage diode. The clamping voltage is a voltage of the sum of the forward voltage drops across the clamping diodes, connected in series, when they are in conduction mode, added by the voltage of the current sinking node minus the forward voltage drop across the first high-voltage diode during the conduction mode of the clamping diodes. The voltage clamp circuit inherently keeps current equilibrium, allowing the voltage clamp circuit to operate at high speed. Therefore, there is no delay caused by a RC time constant and there aren't any problems with parasitic coupling elements, keeping the voltage clearly within the desired range, even during state transitions of the semiconductor switching element.

In a preferred embodiment of the invention, the current sinking node is the anode of the first high-voltage diode. The voltage of the sinking node is the forward voltage drop across the first high-voltage diode in case the cathode of the first high-voltage diode is connected to the line of ground voltage GND. The clamping voltage is in this case a voltage of the sum of the forward voltage drops across the clamping diodes when they are in conduction mode.

In a yet another preferred embodiment of the invention, the current sinking node is the line of ground voltage GND. The voltage of the current sinking node is zero. The clamping voltage now is a voltage of the sum of the forward voltage drops across the clamping diodes when they are in conduction mode minus the forward voltage drop across the first high voltage-diode during this conduction mode.

In another preferred embodiment of the invention the voltage clamping diodes and high voltage diodes have a low parasitic capacitance and low reverse recovery current, allowing the use of components with very low current ratings. The series connection of multiple clamping diodes is preferred above the use of one Zener diode as this lowers the total parasitic capacitance of the clamping diodes.

The forward voltage drops across the high-voltage diodes are preferably equal, more preferably they are equal when these diodes carry equal currents. Therefore the high-voltage diodes preferably have the same performance characteristics and preferably are of the same semiconductor batch. A thermal coupling of the high-voltage diodes is also preferred.

In a preferred embodiment the ratio between the forward voltage drops across the high-voltage diodes, is about 1, more preferably equal to 1.

As a current mirror circuit, the Wilson current mirror topology is preferred as it has the advantage of virtually eliminating the base current mismatch of a conventional current mirror and thereby ensuring that the mirrored current is almost identical to the reference current. It also has a very high output impedance.

In another embodiment of the present invention an additional current injection circuit is added, injecting a current in the positive output node during the transition from the off-state to the on-state of the semiconductor switching element. Hereby, the mirrored currents can be kept small since the current that is needed to discharge the parasitic capacitance of the second high-voltage diode is now provided by the current injection circuit. The rest of the circuit configuration may be identical as in the previous embodiments.

A semiconductor device and an overcurrent protection circuit according to other aspects of the present invention each include the foregoing voltage clamp circuit, and therefore the voltage between terminals of a semiconductor switching element can be easily detected, being an indication for the current flowing through it.

A voltage measurement probe, a voltage measurement device and a semiconductor evaluation device according to other aspects of the present invention each include the foregoing voltage clamp circuit, and therefore the on-state voltage and consequently the dynamic on-resistance of a semiconductor switching element can be easily measured.

The foregoing object and other objects, features, aspects and advantages of the present invention will become more clear from following detailed description of the present invention when taken in conjunction with the accompanying drawings.

Particular and preferred aspects of the invention are set out in the accompanying independent and dependent claims. Features from the dependent claims may be combined with features of the independent claims and with features of other dependent claims as appropriate and not merely as explicitly set out in the claims.

Figure 1:
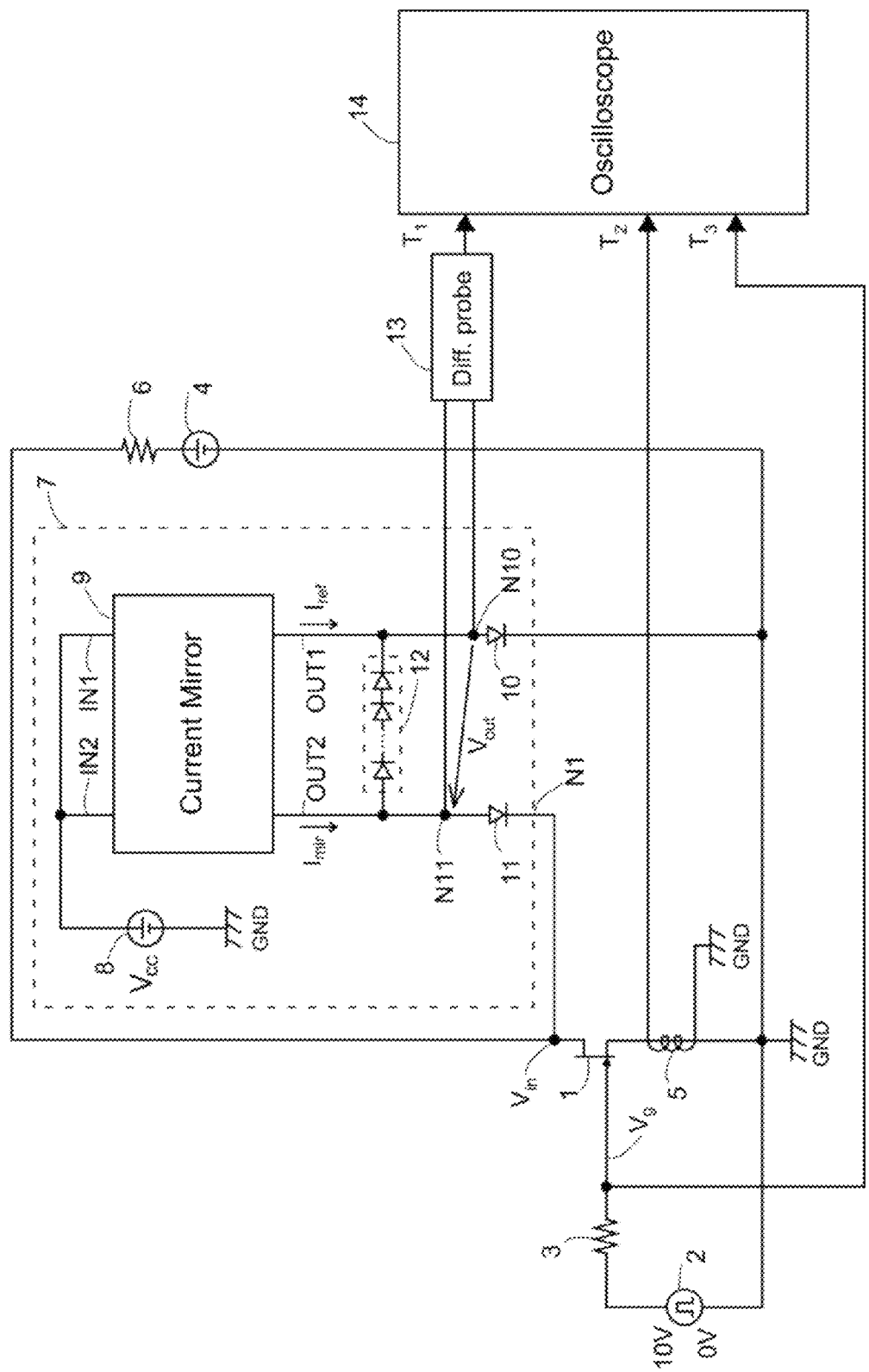
FIG. 1 is a circuit block diagram showing a configuration of a semiconductor evaluation device according to a first embodiment of the present invention.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF THE INVENTION

The present invention will be described with respect to particular embodiments and with reference to certain drawings but the invention is not limited thereto but only by the claims.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

Where in embodiments of the present invention reference is made to a circuit for providing at least two currents, reference is made to an electronic circuit in which two currents flow, each from an input node to an output node. When the at least two currents are equal, reference is made to a current mirror circuit. One of the currents is designated as the reference current, and the other is designated as the mirrored current. Where in embodiments of the present invention reference is made to two currents that are equal, reference is made to two currents that are identical to each other or to two currents that are equal to each other within a small tolerance. Such a small tolerance may be within 5%, e.g. within 4%, e.g. within 3%, e.g. within 2%, e.g. within 1%.

Where in embodiments of the present invention reference is made to a current sinking node of a voltage clamp circuit, reference is made to a node in the circuit to which the current is led. Such a node typically may be at low voltage or at ground. In embodiments of the present invention, the alternative current path, e.g. comprising a series connection of clamping diodes, is connected to the current sinking node. On the other side, the alternative current path, e.g. comprising a series connection of clamping diodes, is connected to the positive output node of the voltage clamp circuit. By way of illustration—embodiments of the present invention not being limited thereby—a number of examples of the current sinking node are given in the description below: in a first embodiment of the voltage clamp circuit, the current sinking node is the anode of the first high-voltage diode and in a second embodiment of the voltage clamp circuit, the current sinking node is the line of ground voltage GND.

In a first aspect, the present invention relates to a voltage clamp circuit for reflecting a voltage at an input node between two output nodes. The voltage clamp circuit according to embodiments of the present invention comprises a circuit for providing at least two currents at its output terminals. As will be illustrated, such a circuit may advantageously be a current mirror circuit or a circuit providing equal or substantially equal currents. The voltage clamp circuit furthermore comprises at least two diodes each being connected to an output terminal of the circuit for providing at least two currents. The at least two diodes may for example be high voltage diodes or may be at least two series of low voltage diodes. The latter may be advantageous for keeping the parasitic capacitance low. One of the at least two diodes is further connected to a ground voltage and one of the at least two diodes is further connected to the input node. The voltage clamp circuit furthermore comprises an alternative current path, e.g. comprising or consisting of a clamping diode or a series connection of more clamping diodes, also referred to as a series connection of one or more clamping diodes. The alternative current path is connected to an output terminal of the circuit for providing at least two currents and to a current sinking node, so that the voltage at the input node is reflected as the voltage between two output nodes when the voltage at the input node is lower than a clamping voltage and so that a voltage between the two output nodes is fixed to the clamping voltage when the voltage at the input node is higher than the clamping voltage. In some embodiments, the voltage between the two output nodes is no direct mapping of the voltage at the input node, but the voltage at the input node can be determined based on the voltage between the two output nodes and a correction for the use of non-equal currents and/or for the use of at least two diodes having no equal current-voltage characteristic. The system therefore may comprise a compensation means for compensating for non-equal currents and/or for unequal diode characteristics.

It is an advantage of embodiments of the present invention that voltage spikes that could occur at the output node during voltage transitions at the input node are avoided since, e.g. when using a current mirror circuit, the mirror current $I_{mir}$ charges the parasitic capacitive coupling element between the input node and the output node during the transition from a high voltage to a low voltage at the input node. During the transition from a low voltage to a high voltage at the input node, both the current to discharge the parasitic capacitive coupling element between the input node and the output node and the reverse recovery current of the high-voltage diode flow through the clamping diodes to the current sinking node, together with the mirror current $I_{mir}$.

It is an advantage of embodiments of the present invention that, since the parasitic capacitance between the input node and the output node is charged by a current source ($I_{mir}$) during the transition from a high voltage to a low voltage at the input node, and discharged through a low resistance path during the transition from a low voltage to a high voltage at the input node, there is no RC time-delay and the response speed of the voltage clamp circuit to these voltage transitions at the input node is very high. It is an advantage of embodiments of the present invention that the voltage clamp circuit uses components that are easy to find, cheap, and that are used within their operating ranges.

It is an advantage of embodiments of the present invention that there is no need for an active control system to operate the voltage clamp circuit.

It is an advantage of embodiments according to the present invention that systems with a good dynamic behaviour are provided.

It is an advantage of embodiments according to the present invention that characterisation systems are provided allowing to obtain characterisation with high accuracy.

By way of illustration, embodiments of the present invention not being limited thereto, a number of particular embodiments of the present invention will further be discussed with reference to the drawings.

FIG. 1 is a circuit block diagram showing a configuration of a semiconductor evaluation device according to the first particular embodiment of the present invention. In FIG. 1, the semiconductor evaluation device is for measuring a dynamic on-resistance, an on-state voltage and the like of a semiconductor switching element (e.g. field-effect transistor) 1 to be evaluated. It includes a pulse generating circuit (gate drive circuit) 2, resistance elements 3 and 6, a DC power supply 4, a current detector (current measurement) 5, a voltage clamp circuit 7, and an oscilloscope 14 with a differential measurement 13.

A source of semiconductor switching element 1 is grounded, a gate thereof is connected via resistance element 3 to pulse generator circuit 2, and a drain thereof is connected via resistance element 6 to DC power supply 4. Current detector 5 is preferably placed in the line between the source of semiconductor switching element 1 and the line of a ground voltage GND, as explained below. The resistance value of load-resistance element 6 is, e.g., 10Ω and the output voltage of DC power supply 4 is, e.g., 100 V.

Output nodes N10 and N11 of voltage clamp circuit 7 are connected to a first input terminal T1 of oscilloscope 14 via differential measurement 13. A second input terminal T2 and a third input terminal T3 of oscilloscope 14 are connected to current detector 5 and the gate of semiconductor switching element 1, respectively.

Voltage clamp circuit 7 includes a DC power supply 8, two high-voltage diodes 10 and 11, a current mirror circuit 9 and a series connection of one or more clamping diodes 12. DC power supply 8 is connected with a negative terminal connector to the line of ground voltage GND and with a positive terminal connector to two input-power terminals IN1 and IN2 of current mirror circuit 9. A first output terminal connector OUT1 of current mirror circuit 9 is connected to an anode of first high-voltage diode 10. A cathode of high-voltage diode 10 is connected to the line of ground voltage GND. A second output terminal connector OUT2 of current mirror circuit 9 is connected to an anode of second high-voltage diode 11. A cathode of high-voltage diode 11 is connected to an input node N1 of voltage clamp circuit 7. Clamping diodes 12 are connected in series, thus their cathode is connected to an anode of their neighbour and their anode is connected to a cathode of their neighbour. A cathode of a last clamping diode is connected to the anode of first high-voltage diode 10, denoted output node N10 of voltage clamp circuit 7. An anode of a first clamping diode is connected to the anode of second high-voltage diode 11, denoted output node N11 of voltage clamp circuit 7.

Input node N1 of voltage clamp circuit 7 is connected to the drain of semiconductor switching element 1, and output nodes N10 and N11 are connected to first input terminal T1 of oscilloscope 14 via differential measurement 13.

The working mechanism of voltage clamp circuit 7 will now be explained with FIG. 1. Current mirror circuit 9 produces a reference current $I_{ref}$, flowing out of the first output terminal connector OUT1 of current mirror circuit 9, through high-voltage diode 10 to the line of ground voltage GND. When semiconductor switching element 1 is in the on-state, a mirrored current $I_{mir}$ flows out of the second output terminal connector OUT2 of current mirror circuit 9, through high-voltage diode 11 to input node N1. Reference current $I_{ref}$ and mirrored current $I_{mir}$ of current mirror circuit 9 are preferably about equal, more preferably $I_{ref}$ and $I_{mir}$ are equal, and high-voltage diodes 10 and 11 have the same performance characteristics. This means that high-voltage diodes 10 and 11 have the same forward voltage drop for the same currents flowing through them, causing the voltage difference between output nodes N10 and N11, $V_{out}$, to be equal to the on-state voltage drop of semiconductor switching element 1, $V_{out}=V_{in}$. When semiconductor switching element 1 is in the off-state, mirrored current $I_{mir}$ flows out of the second output terminal connector OUT2 of current mirror circuit 9, through clamping diodes 12 and through high-voltage diode 10 to the line of ground voltage GND. High-voltage diode 11 is reverse biased. Now the voltage difference between output nodes N10 and N11 equals the sum of the forward voltage drops across clamping diodes 12, $V_{out}=V_c$. Accordingly, voltage $V_{out}$ between output nodes N10 and N11 is limited to at most $V_c$, and therefore the range of the voltage at first input terminal T1 of oscilloscope 14 may be set to one wide enough for $V_c$. The number of clamping diodes 12 determines $V_c$. For example, when there are 3 clamping diodes, each having a voltage drop of 0.7V, $V_c=3*0.7=2.1$ V.

Typically, a differential voltage probe 13, connected to an oscilloscope 14 is used to perform the measurement of the voltage difference between output nodes N10 and N11. A positive terminal connector of differential probe 13 is connected to output node N11 and a negative terminal connector of differential probe 13 is connected to output node N10.

It is advantageous that diodes 10 and 11 are high-voltage diodes. High-voltage diodes 10 and 11 preferably have the same performance characteristics and are preferably of the same semiconductor batch in order to acquire equal forward voltage drops across high-voltage diodes 10 and 11 when they carry identical currents. Preferably they are thermally coupled. Clamping diodes 12 can be low voltage diodes.

The sum of the forward voltage drops across clamping diodes 12 is advantageously selected larger than the on-state voltage $V_{on}$ of semiconductor switching element 1 which is being measured. Furthermore, it is necessary that the leakage current, flowing through clamping diodes 12 when a low forward voltage ($V_{on}$) is across them, is small. The reason for this is that during the on-state of the semiconductor switching element 1, most of mirrored current $I_{mir}$ will flow through high-voltage diode 11 to the drain of semiconductor switching element 1, but also some leakage current will flow through clamping diodes 12 and through high-voltage diode 10. This means that in that case, the currents through high-voltage diodes 10 and 11 are not equal anymore and the forward voltage drops across high-voltage diodes 10 and 11 also differ. Clamping diodes 12 thus preferably have an I-V characteristic where low leakage currents flow at low forward voltages.

Figure 2:
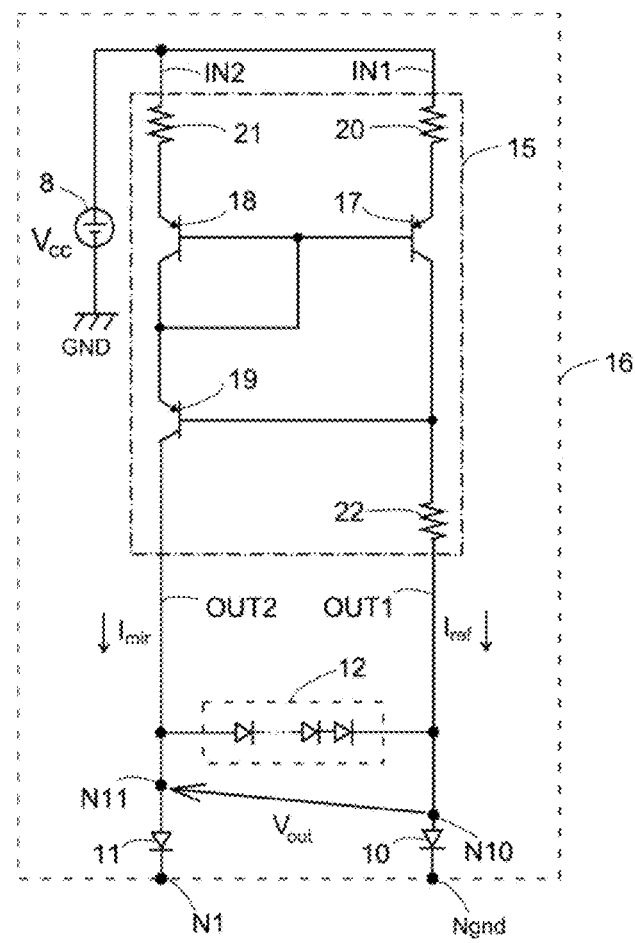
FIG. 2 is a circuit block diagram showing a voltage clamp circuit according to a first embodiment of the present invention where a Wilson current mirror is used as current mirror circuit.

Current mirror circuit 9 is preferably of the Wilson topology as it has the advantage of virtually eliminating the base current mismatch of a conventional current mirror and thereby ensuring that mirrored current $I_{mir}$ is almost identical to reference current $I_{ref}$. It also has a very high output impedance. FIG. 2 shows an example of a voltage clamp circuit 16 like voltage clamp circuit 7 in FIG. 1 where current mirror circuit 9 is a Wilson current mirror circuit 15. Wilson current mirror circuit 15 is made with three pnp-bipolar transistors 17, 18 and 19 and three resistance elements 20, 21 and 22. One terminal of resistance element 20 is connected to input-power terminal IN1 of Wilson current mirror circuit 15 and an other terminal of resistance element 20 is connected to an emitter of transistor 17. One terminal of resistance element 21 is connected to input-power terminal IN2 of Wilson current mirror circuit 15 and an other terminal of resistance element 21 is connected to an emitter of transistor 18. A collector of transistor 17 is connected to one terminal of resistance element 22. An other terminal of resistance element 22 is connected to the first output terminal connector OUT1 of current mirror circuit 15. A collector of transistor 18 is connected to its own base and to an emitter of transistor 19. A collector of transistor 19 is connected to the second output terminal connector OUT2 of current mirror circuit 15. A base of transistor 17 is connected to the base of transistor 18. A base of transistor 19 is connected to the collector of transistor 17. Resistance elements 20 and 21 are used to compensate for temperature differences or differences in current gain between transistors 17 and 18. They are chosen so that a voltage across them is a few tenths of a Volt. However, even though in FIG. 2, a Wilson current mirror 15 is depicted, any current mirror circuit, fabricated in any type of technology, can be used with voltage clamp circuit 7 of FIG. 1. A current mirror circuit 9 is then defined (FIG. 1) as a circuit which allows a current to flow between its terminals IN1 and OUT1, denoted as reference current $I_{ref}$ and a second current, denoted as mirrored current $I_{mir}$, between terminals IN2 and OUT2, which has the same value as reference current $I_{ref}$.

As explained above, when semiconductor switching element 1 is in its on-state, mirrored current $I_{mir}$ flows out of the second output terminal connector OUT2 of current mirror circuit 9, through high-voltage diode 11 to input node N1. This current is thus injected into the drain of semiconductor switching element 1, causing an additional on-state drain-to-source voltage drop of semiconductor switching element 1. To include this extra drain current (mirrored current $I_{mir}$) in the measurement, current detector 5 is placed somewhere between input node N1 and the line of ground voltage GND. In this way, no error on the on-voltage measurement is introduced. Preferably current detector 5 is placed between the source of semiconductor switching element 1 and the line of ground voltage GND when using shunt resistors for measuring the current. Typically mirrored current $I_{mir}$ is small (e.g. 70 mA) compared to the drain current of semiconductor switching element 1.

With connections made as described above (FIG. 1), gate voltage $V_g$ of semiconductor switching element 1, output voltage $V_{out}$ of voltage clamp circuit 7 and the drain current of semiconductor switching element 1 are measured with oscilloscope 14. Gate voltage $V_g$ is used as a trigger of the time base sweep of oscilloscope 14.

Figure 3:
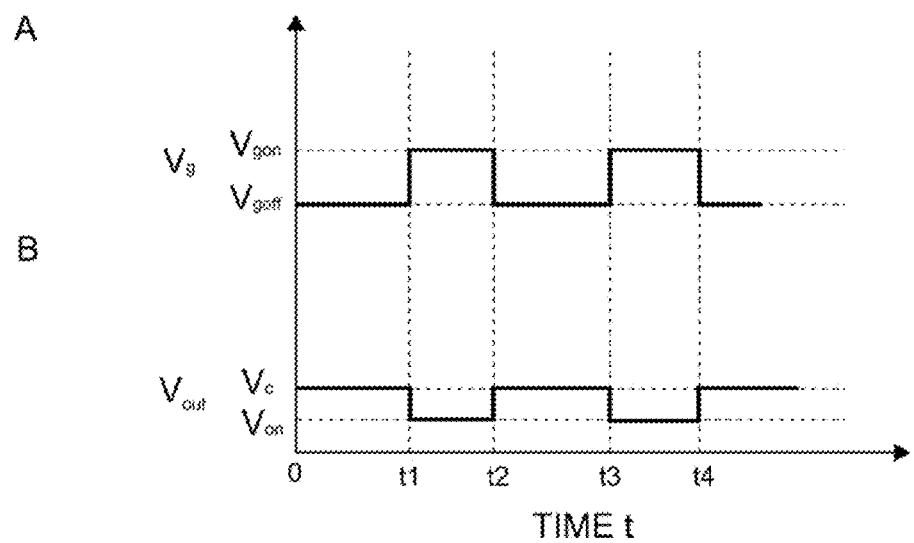
FIG. 3 is a time chart showing operations of the gate voltage (part A) and of the output voltage (part B) of the semiconductor device to be evaluated in the semiconductor evaluation device shown in FIG. 1.

FIG. 3 (part A) is a time chart showing the gate voltage $V_g$ of semiconductor switching element 1, and FIG. 3 (part B) is a time chart showing output voltage $V_{out}$ of voltage clamp circuit 7. Gate voltage $V_g$ is alternately switched between low voltage $V_{goff}$ and high voltage $V_{gon}$. When $V_g$ becomes $V_{goff}$, semiconductor switching element 1 is turned off, so that drain voltage $V_{in}$ of semiconductor switching element 1 becomes approximately equal to the DC power supply voltage (100 V) while output voltage $V_{out}$ of voltage clamp circuit 7 is fixed to clamping voltage $V_c$.

When $V_g$ is raised from $V_{goff}$ to $V_{gon}$, semiconductor switching element 1 is turned on, so that drain voltage $V_{in}$ abruptly drops, and when $V_{in}$ becomes not more than $V_c$, $V_{out}=V_{in}$. The on-resistance of semiconductor switching element 1 is, e.g., 0.1Ω $V_{in}$ becomes the voltage obtained by the multiplication of the on-resistance (0.1Ω) of semiconductor switching element 1 with DC power supply voltage (100V), divided by the addition of the on-resistance (0.1Ω) of semiconductor switching element 1 and the resistance value (10Ω) of load-resistance element 6, $V_{in}$=0.99 V. This voltage appears between output nodes N10 and N11 of voltage clamp circuit 7.

When $V_g$ drops from $V_{gon}$ to $V_{goff}$, semiconductor switching element 1 is turned off, so that drain voltage $V_{in}$ abruptly rises, and when $V_{in}$ becomes higher than $V_c$, $V_{out}=V_c$ (e.g. 2.1V). This voltage appears between output nodes N10 and N11 of voltage clamp circuit 7.

Therefore, by setting the full scale of oscilloscope 14 to 2.1 V, oscilloscope 14 is not saturated even at the time point of the off-state of semiconductor switching element 1. The on-state voltage is measured with an accuracy of 2.1/2^8=0.0082 V on an oscilloscope with 8 bit analog-to-digital converters. Thus, the on-state voltage of 0.99 V and the on-resistance of semiconductor switching element 1 can accurately be obtained with this setup.

The delay time of voltage clamp circuit 7 will now be considered. The operations of semiconductor switching element 1 when changing from the off-state to the on-state can be divided into two regions: a first region in which drain voltage $V_{in}$ of semiconductor switching element 1 changes from the power supply voltage (100 V) to clamping voltage $V_c$ (=2.1V), and a second region in which the drain voltage $V_{in}$ of semiconductor switching element 1 changes from clamping voltage $V_c$ (=2.1V) to on-state voltage $V_{on}$ (=0.99V).

In above first region, output node N11 is fixed at the clamping voltage $V_c$, added by the constant forward voltage drop across high-voltage diode 10. The latter is due to the constant reference current $I_{ref}$, added by the mirrored current $I_{mir}$, flowing through high-voltage diode 10 at that moment. Thus the voltage across high-voltage diode 11 changes when the drain voltage of semiconductor switching element 1 drops, requiring a current to discharge the parasitic capacitance of high-voltage diode 11. This current is subtracted from the mirrored current $I_{mir}$ that is flowing through clamping diodes 12 and high voltage diode 10 at that moment. Voltage clamp circuit 7 will thus not affect the operation speed in above first region as current equilibrium is inherently kept.

In above second region, drain voltage $V_{in}$ of semiconductor switching element 1 drops below the clamping voltage $V_c$ (=2.1V), putting high-voltage diode 11 in conduction mode. Output node N11 now follows the drain voltage $V_{in}$ of semiconductor switching element 1 added by a constant forward voltage drop across high-voltage diode 11. The latter is due to the mirrored current $I_{mir}$ flowing through high-voltage diode 11 at that moment. Clamping diodes 12 do not conduct a forward current anymore. Output node N10 is fixed at the constant forward voltage drop across high-voltage diode 10. The latter is due to the constant reference current $I_{ref}$ flowing through high-voltage diode 10. As a result, the voltage across clamping diodes 12 changes, requiring a current to discharge their parasitic capacitances, including the capacitance of differential probe 13 and oscilloscope 14. This current is subtracted from reference current $I_{ref}$ flowing through high-voltage diode 10 and added to mirrored current $I_{mir}$ flowing through high-voltage diode 11 at that moment. Voltage clamp circuit 7 will thus not affect the operation speed in above second region as current equilibrium is inherently kept.

As explained above, voltage clamp circuit 7 does not affect the operation speed during the switching transitions of semiconductor element 1, allowing voltage clamp circuit 7 to operate at high speed. The reason for this is that, as explained above, voltage clamp circuit 7 inherently keeps current equilibrium. There is no delay caused by a RC time constant and there aren't any problems with parasitic coupling elements, keeping the voltage clearly within the wanted range, even during state transitions of semiconductor switching element 1.

In above first region, switching speed is determined by mirrored current $I_{mir}$ as this is used to discharge the parasitic capacitance of high-voltage diode 11. For example, when high-voltage diode 11 has a parasitic capacitance of 1 pF and the mirrored current=0.1 A, a drain voltage drop of (100−2.1=97.9 V can occur in (97.9*1*10^12)/0.1=0.98 ns. Using higher mirror currents ($I_{ref}$ and $I_{mir}$) can decrease this value even further. Switching speed is thus limited by the current rating of the components that have to carry these mirror currents. In above second region, switching speed is determined by reference current $I_{ref}$ as this is used to discharge the parasitic capacitance of clamping diodes 12. For example, when clamping diodes 12 have a parasitic capacitance of 1 pF and the reference current $I_{ref}$=0.1 A, the clamping voltage can drop from 2.1 to 0.99 V in ((2.1−0.99)*1*10^−12)/0.1=11.1 ps.

Clamping diodes 12 and high voltage diodes 10 and 11 preferably have a low parasitic capacitance and low reverse recovery current. The series connection of more clamping diodes 12 is preferred as this lowers the total parasitic capacitance of clamping diodes 12.

Figure 4:
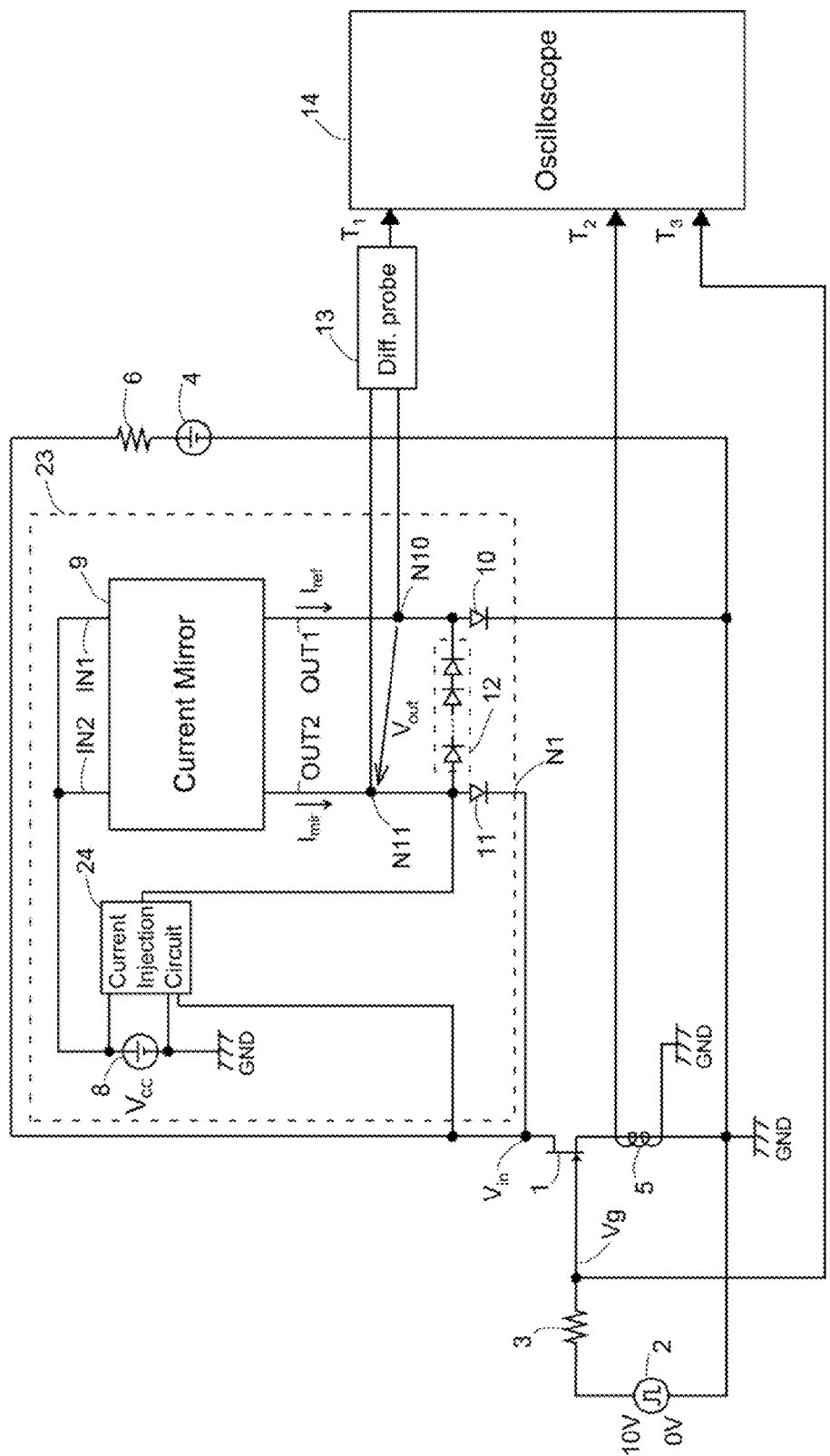
FIG. 4 is a circuit block diagram showing a modification of the configuration of a semiconductor evaluation device according to the first embodiment of the present invention.

FIG. 4 is a circuit block diagram showing a first modification of the first embodiment, which is to be compared with FIG. 1. With reference to FIG. 4, the semiconductor evaluation device differs from the semiconductor evaluation device of FIG. 1 in that voltage clamp circuit 7 is replaced by a voltage clamp circuit 23 where an additional current injection circuit 24 is added. This current injection circuit 24 injects a current in output node 11 during the transition from the off-state to the on-state of semiconductor switching element 1, in which drain voltage $V_{in}$ of semiconductor switching element 1 changes from DC power supply voltage (100 V) to on-state voltage Von (0.99V). Hereby the mirrored currents ($I_{ref}$ and $I_{mir}$) can be kept smaller as the current needed to discharge the parasitic capacitance of high-voltage diode 11 is now provided by current injection circuit 24. As a result, the operation speed of voltage clamp circuit 7 can be increased while not increasing the mirrored currents ($I_{ref}$ and $I_{mir}$). Input voltage $V_{in}$ is used to derive the moment of current injection, necessitating a connection between current injection circuit 24 and input node N1. There is also a connection of current injection circuit 24 with the line of ground voltage GND, the positive terminal connector of DC power supply 8 and node N11.

In a second modification of the first embodiment, clamping diodes 12 are replaced by a Zener diode which is connected with a cathode to the anode of high-voltage diode 11 and with an anode to the anode of high-voltage diode 10. This modification has the advantage that less components are used. The disadvantage is the higher parasitic capacitance of the Zener diode compared to the parasitic capacitance of the series connection of clamping diodes 12 in FIG. 1. Clamping voltage $V_c$ now is a voltage equal to the Zener voltage $V_z$ of the Zener diode.

A series connection of two or more Zener diodes is also possible. This third modification of the first embodiment is useful to increase the clamping voltage $V_c$ and at the same time, decreasing the net capacitance of the series connection of the Zener diodes.

In a fourth modification of the first embodiment, high-voltage diodes 10 and 11 are replaced by a series connection of two or more diodes. This modification can be useful to increase the blocking voltage and at the same time, decreasing the net parasitic capacitance of the series connection of the high-voltage diodes.

In a fifth modification of the first embodiment, high-voltage diodes 10 and 11 and/or clamping diodes 12 are replaced by a series connection of one or more transistors, which are used as diodes. This modification can be useful to integrate voltage clamp circuit 7 on a chip.

Figure 5:
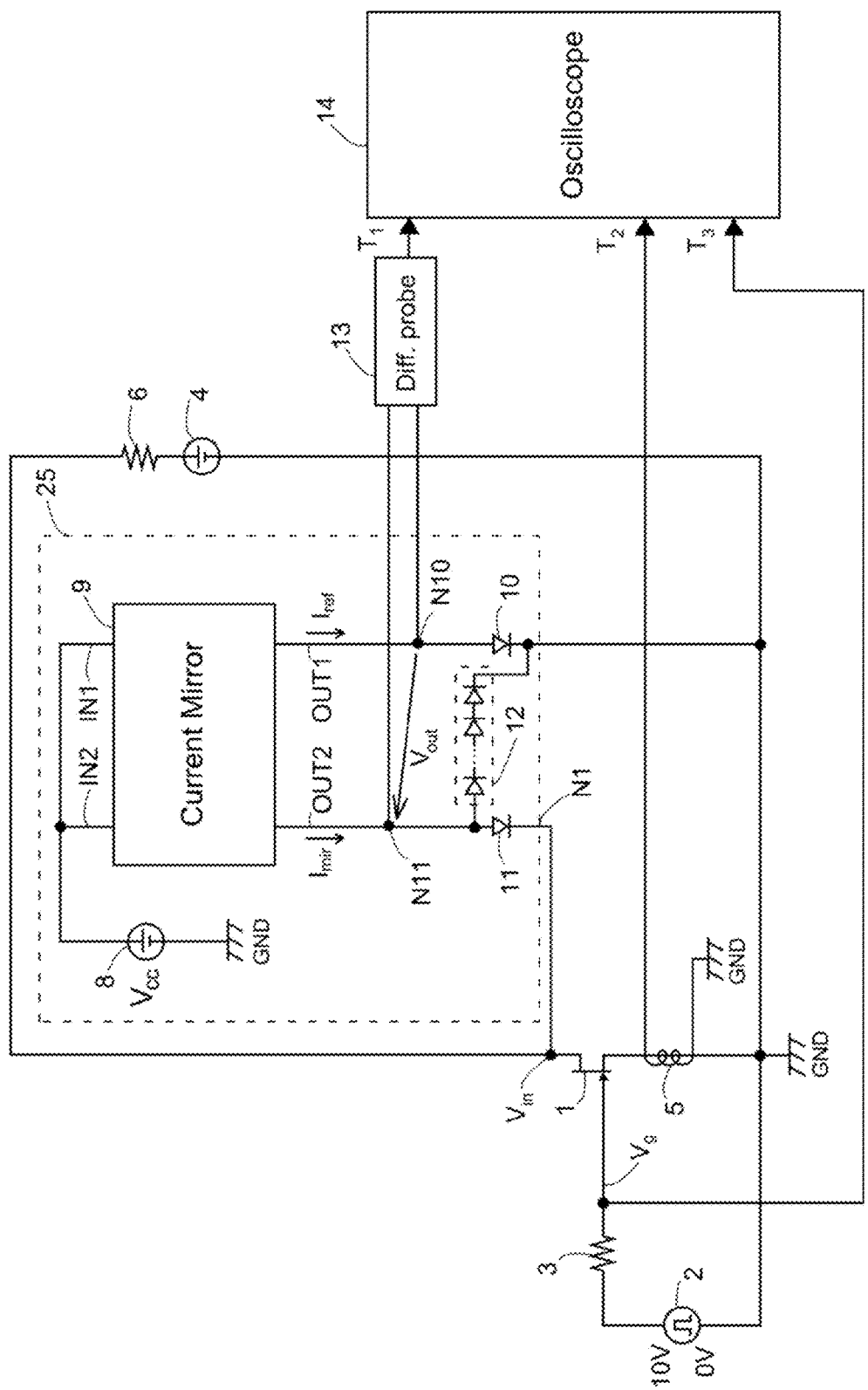
FIG. 5 is a circuit block diagram showing a configuration of a semiconductor evaluation device according to a second embodiment of the present invention.

FIG. 5 is a circuit block diagram showing a configuration of a semiconductor evaluation device according to the second embodiment of the present invention, which is to be compared with FIG. 1. With reference to FIG. 5, the semiconductor evaluation device only differs from the semiconductor evaluation device of FIG. 1 in that voltage clamp circuit 7 is replaced by a voltage clamp circuit 25.

Voltage clamp circuit 25 includes a DC power supply 8, two high-voltage diodes 10 and 11, a current mirror circuit 9 and a series connection of one or more clamping diodes 12. The DC power supply 8 is connected with a negative terminal connector to the line of ground voltage GND and with a positive terminal connector to two input-power terminals IN1 and IN2 of current mirror circuit 9. A first output terminal connector OUT1 of current mirror circuit 9 is connected to an anode of first high-voltage diode 10. A cathode of high-voltage diode 10 is connected to the line of ground voltage GND. A second output terminal connector OUT2 of current mirror circuit 9 is connected to an anode of second high-voltage diode 11. A cathode of high-voltage diode 11 is connected to an input node N1 of voltage clamp circuit 25. Clamping diodes 12 are connected in series, thus their cathode is connected to an anode of their neighbour and their anode is connected to a cathode of their neighbour. A cathode of a last clamping diode is connected to the line of ground voltage GND. An anode of a first clamping diode is connected to the anode of second high-voltage diode 11, denoted output node N11 of voltage clamp circuit 25. The anode of first high-voltage diode 10 is denoted output node N10 of voltage clamp circuit 25.

The working mechanism of voltage clamp circuit 25 will now be explained with FIG. 5. Current mirror circuit 9 produces a reference current $I_{ref}$, flowing out of the first output terminal connector OUT1 of current mirror circuit 9, through high-voltage diode 10 to the line of ground voltage GND. When semiconductor switching element 1 is in the on-state, a mirrored current $I_{mir}$ flows out of the second output terminal connector OUT2 of current mirror circuit 9, through high-voltage diode 11 to input node N1. Reference current $I_{ref}$ and mirrored current $I_{mir}$ of current mirror circuit 9 are preferably about equal, more preferably $I_{ref}$ and $I_{mir}$ are equal, and high-voltage diodes 10 and 11 have the same performance characteristics. This means that high-voltage diodes 10 and 11 have the same forward voltage drop, causing the voltage difference between output nodes N10 and N11, $V_{out}$, to be equal to the on-state voltage drop of semiconductor switching element 1, $V_{out}=V_{in}$. When semiconductor switching element 1 is in the off-state, mirrored current $I_{mir}$ flows out of the second output terminal connector OUT2 of current mirror circuit 9, through clamping diodes 12 to the line of ground voltage GND. High-voltage diode 11 is reverse biased. Now the voltage difference between output nodes N10 and N11 equals the sum of the forward voltage drops across clamping diodes 12, minus the forward voltage drop across the first high voltage-diode 10 due to reference current $I_{ref}$ flowing through it. $V_{out}=V_c$. Accordingly, voltage $V_{out}$ between output nodes N10 and N11 is limited to at most $V_c$, and therefore the range of the voltage at first input terminal T1 of oscilloscope 14 may be set to one wide enough for $V_c$. $V_c$ is determined by the number of clamping diodes 12 and the forward voltage drop across high-voltage diode 10 when reference current $I_{ref}$ flows through it. For example, when there are 4 clamping diodes, each having a voltage drop of 0.7V and the forward voltage drop across high-voltage diode 10, when reference current $I_{ref}$ flows through it, is 0.8V, $V_c$=4*0.7−0.8=2V.

When $V_g$ is raised from $V_{goff}$ to $V_{gon}$, semiconductor switching element 1 is turned on, so that drain voltage $V_{in}$ abruptly drops, and when Vin becomes not more than $V_c$, $V_{out}=V_{in}$. The on-resistance of semiconductor switching element 1 is, e.g., 0.1Ω $V_{in}$ becomes the voltage obtained by the multiplication of the on-resistance (0.1Ω) of semiconductor switching element 1 with DC power supply voltage (100V), divided by the addition of the on-resistance (0.1Ω) of semiconductor switching element 1 and the resistance value (1.0Ω) of load-resistance element 6, $V_{in}$=0.99 V. This voltage appears between output nodes N10 and N11 of voltage clamp circuit 25.

When $V_g$ drops from $V_{gon}$ to $V_{goff}$, semiconductor switching element 1 is turned off, so that drain voltage $V_{in}$ abruptly rises, and when $V_{in}$ becomes higher than $V_c$, $V_{out}=V_c$ (e.g. 2V). This voltage appears between output nodes N10 and N11 of voltage clamp circuit 25.

Therefore, by setting the full scale of oscilloscope 14 to 2V, oscilloscope 14 is not saturated even at the time point of the off-state of semiconductor switching element 1. The on-state voltage is measured with an accuracy of 2/2^8=0.0078 V on an oscilloscope with 8 bit analog-to-digital converters. Thus, the on-state voltage of 0.99 V and the on-resistance of semiconductor switching element 1 can accurately be obtained with this setup.

As in voltage clamp circuit 7, voltage clamp circuit 25 inherently keeps current equilibrium, allowing voltage clamp circuit 25 to operate at high speed. Therefore, there is no delay caused by a RC time constant and there aren't any problems with parasitic coupling elements, keeping the voltage clearly within the wanted range. The current needed to discharge the parasitic capacitance of clamping diodes 12 is now flowing directly out of the line of ground voltage GND instead of being subtracted from reference current $I_{ref}$.

Figure 6:
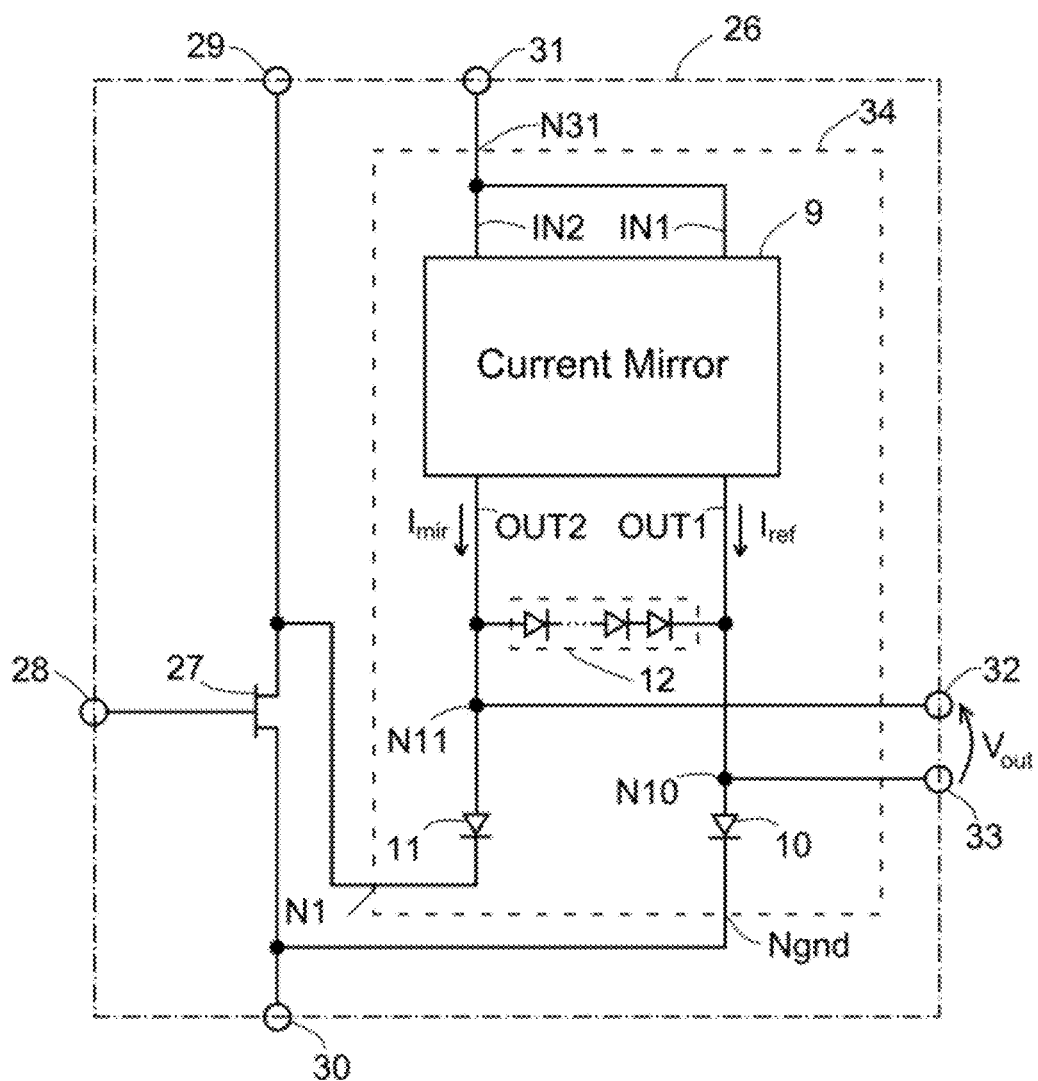
FIG. 6 shows a configuration of a semiconductor device according to a third embodiment of the present invention.

FIG. 6 is a circuit diagram showing a configuration of a semiconductor device (semiconductor chip) 26 according to the third embodiment of the present invention. In FIG. 6, semiconductor device 26 includes a semiconductor switching element 27, voltage clamp circuit 34 where transistors are used as diodes (fifth modification of the first embodiment) and terminals (electrode pads) 28 to 33. These components are formed on a surface of one semiconductor substrate (not shown). Semiconductor switching element 27 has a gate connected to input terminal 28, a drain connected to power supply terminal 29, and a source connected to ground terminal 30.

Compared to FIG. 1, voltage clamp circuit 34 of FIG. 6 only differs from voltage clamp circuit 7 of FIG. 1 in that DC power supply 8 (FIG. 1) is replaced by an external DC power supply to be connected between terminal 31 and ground terminal 30. The diodes used in voltage clamp circuit 34 are transistors used as diodes, according to the fifth modification of the first embodiment of present invention. Voltage clamp circuit 34 has an input node N1 connected to power supply terminal 29, two output nodes N10 and N11, respectively connected to output terminals 33 and 32, and ground node $N_{GND}$ connected to ground terminal 30. Voltage clamp circuit 34 has also an input power node N31 connected to terminal 31 where a DC power supply needs to be connected to supply power to current mirror circuit 9. Terminals 28 to 33 allow connection with the outside of the chip.

Note that voltage clamp circuit 34 may be replaced by voltage clamp circuit 23 of FIG. 4 and may also be replaced by voltage clamp circuit 25 of FIG. 5. Note that also here, all the diodes are transistors used as diodes and the DC-voltage source 8 is an external DC power supply.

Figure 7:
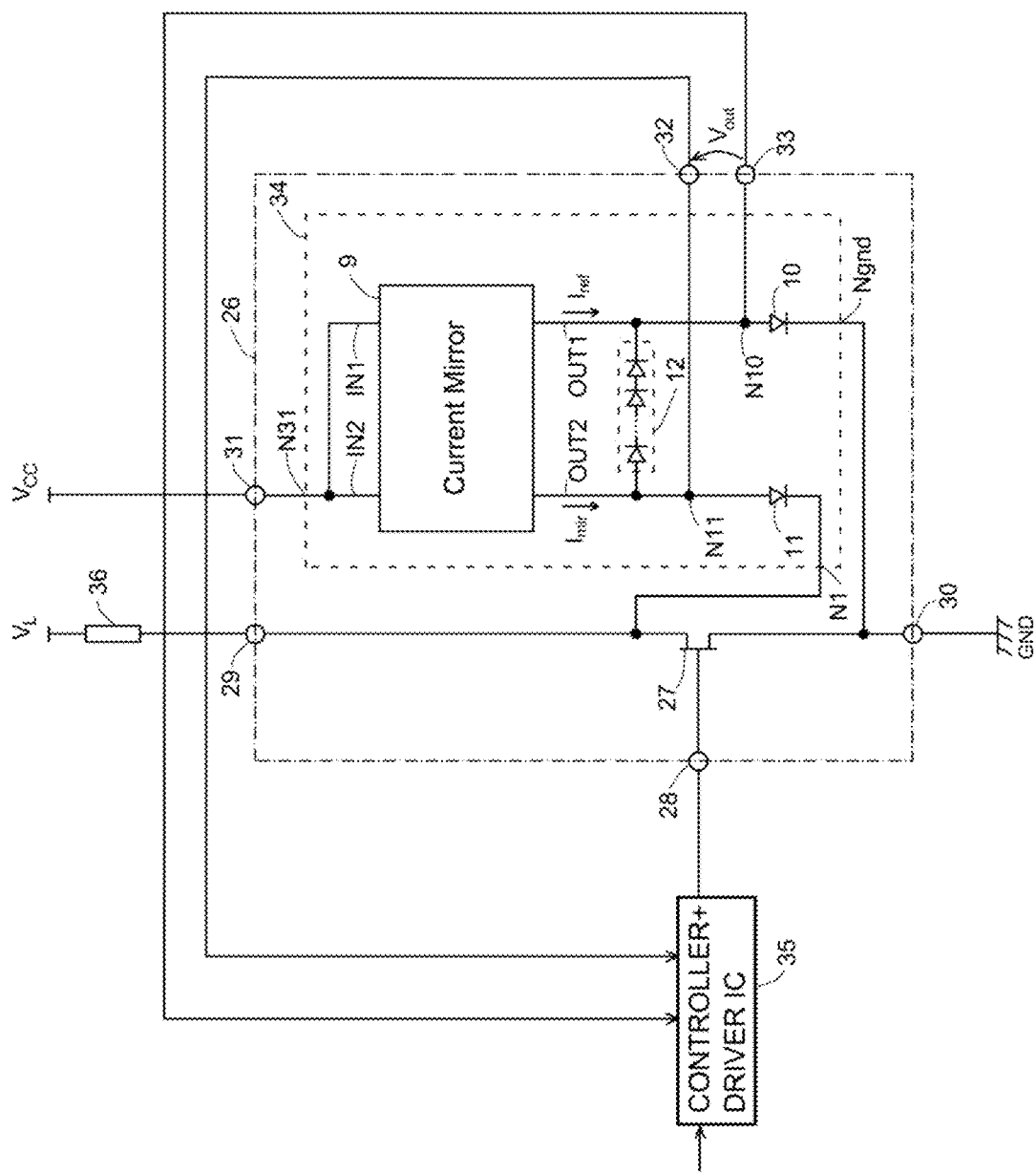
FIG. 7 is a circuit block diagram showing how to use the semiconductor device shown in FIG. 6.

FIG. 7 is a circuit block diagram showing how to use semiconductor device 26. In FIG. 7, input terminal 28 and output terminals 32 and 33 of semiconductor device 26 are connected to a controller/driver IC 35, power supply terminal 29 is connected via a load circuit 36 to the line of a power supply voltage $V_L$, and ground terminal 30 is grounded. Power supply voltage $V_L$ is, e.g., 100 V.

For example, when a control signal φc is at the "L" level, controller/driver IC 35 outputs signals at the "L" level to turn off semiconductor switching element 27, blocking the current flowing in load circuit 36. When the control signal φc is at the "H" level, controller/driver IC 35 outputs signals at the "H" level to turn on semiconductor switching element 27, causing the current to flow in load circuit 36. At this point, if the current of load circuit 36 exceeds a certain level ($I_{max}$) and thus output voltage $V_{out}$ of voltage clamp circuit 34 exceeds a certain level ($V_{out,max}$), controller/driver IC 35 outputs signals at the "L" level to turn off semiconductor switching element 27 to block the current flowing in load circuit 36. Thus, the overcurrent protection of semiconductor element 27 can be performed by means of controller/driver IC 35.

Figure 8:
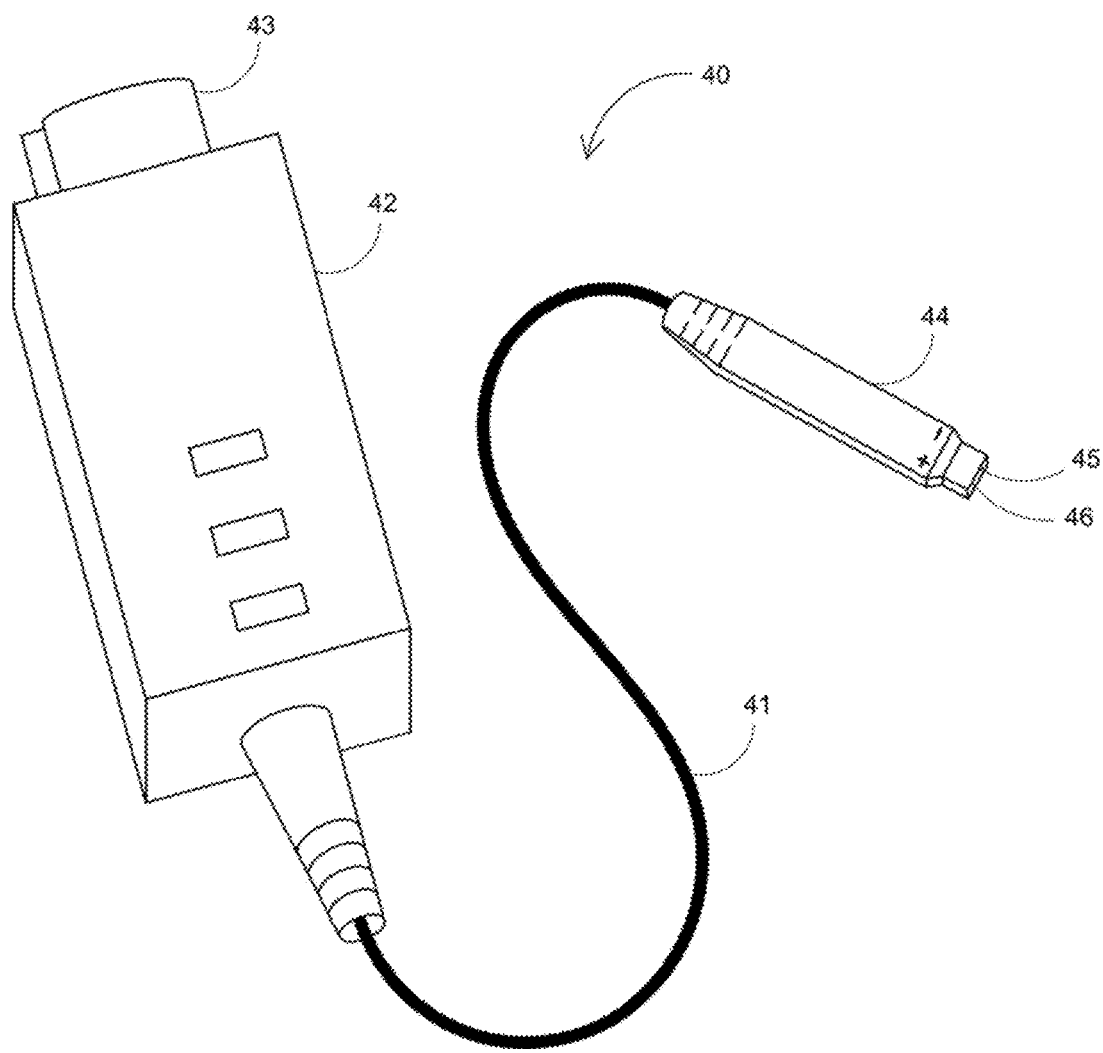
FIG. 8 shows an outline of a voltage measurement probe according to a fourth embodiment of the present invention.

FIG. 8 shows an outline of a differential voltage measurement probe 40 according to the fourth embodiment of the present invention. In FIG. 8, differential voltage measurement probe 40 includes a shielded connection cable 41, a probe head 44, a connection box 42, and a connector 43.

Probe head 44 includes a differential input consisting of positive connection pin 46 and negative connection pin 45.

Figure 9:
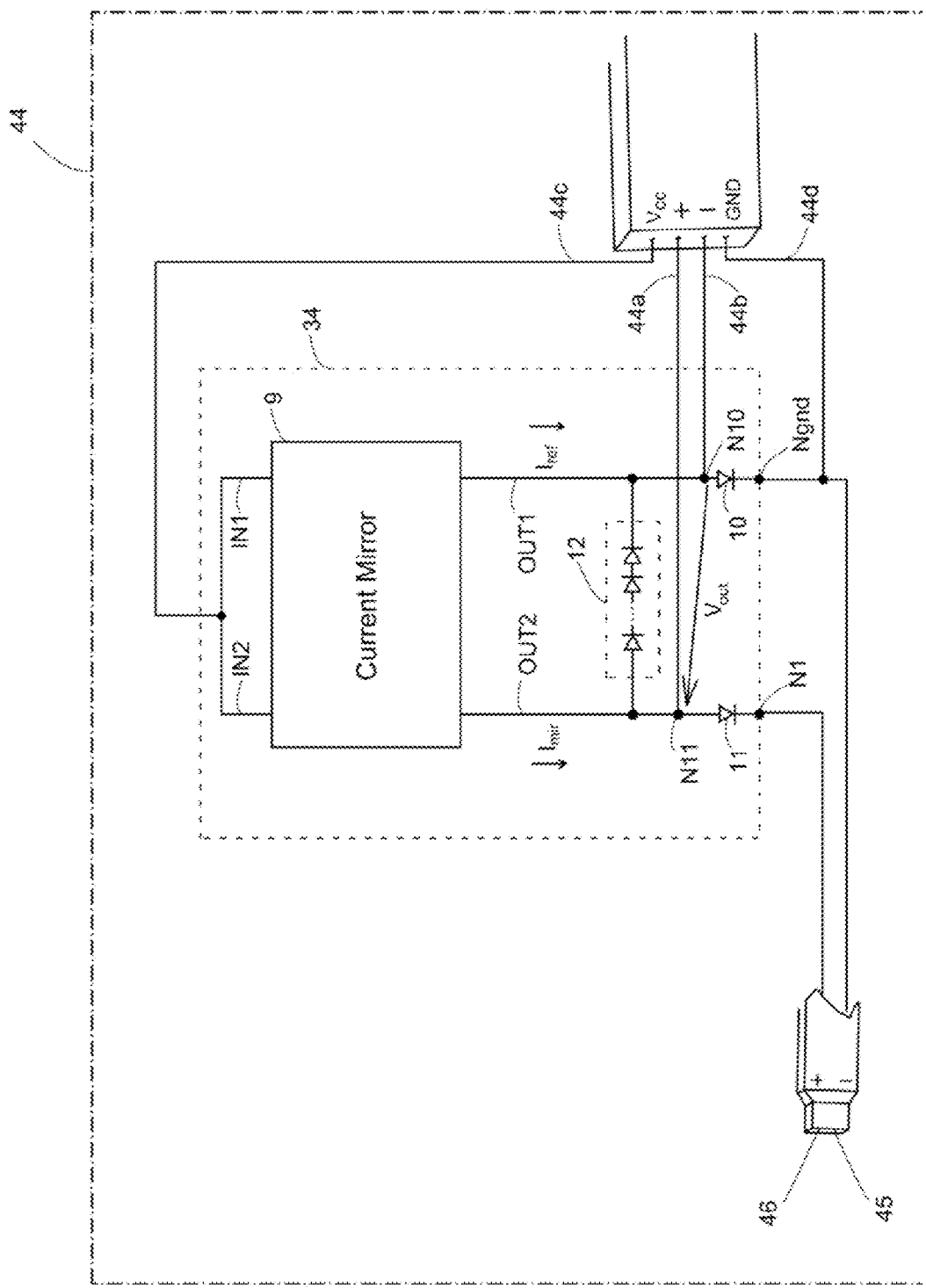
FIG. 9 is a circuit block diagram showing a main portion of the voltage measurement probe shown in FIG. 8.

FIG. 9 shows that the base portion of positive connection pin 46 is connected to input node N1 of voltage clamp circuit 34 and the base portion of negative connection pin 45 is connected to a ground node $N_{GND}$ of voltage clamp circuit 34. Compared to FIG. 1, voltage clamp circuit 34 of FIG. 9 differs from voltage clamp circuit 7 of FIG. 1 in that DC power supply 8 (FIG. 1) is a DC power supply being provided by probe head 44. The base portion of a positive signal conductor 44a is connected to the first output node N11 of voltage clamp circuit 34, and the base portion of a negative signal conductor 44b is connected to the second output node N10 of voltage clamp circuit 34.

The ground node $N_{GND}$ of voltage clamp circuit 34 is connected to the line of a ground voltage GND via connection 44d. The input-power terminals IN1 and IN2 of voltage clamp circuit 34 are connected to a DC power supply $V_{cc}$ via connection 44c. The other end of shielded connection cable 41 is connected, via connection box 42, to connector 43 (FIG. 8). Connector 43 can be connected to an input terminal of an oscilloscope.

The voltage detected between positive connection pin 46 and negative connection pin 45 is provided via voltage clamp circuit 34, shielded connection cable 41, connection box 42 and connector 43 to an oscilloscope. The voltage input of this oscilloscope is then limited by voltage clamp circuit 34 to at most clamping voltage $V_c$.

Note that voltage clamp circuit 34 may be replaced by voltage clamp circuit 23 of FIG. 4 and may also be replaced by voltage clamp circuit 25 of FIG. 5. Note that also here the DC-voltage source 8 is a DC power supply being provided by probe head 44.

Figure 10:
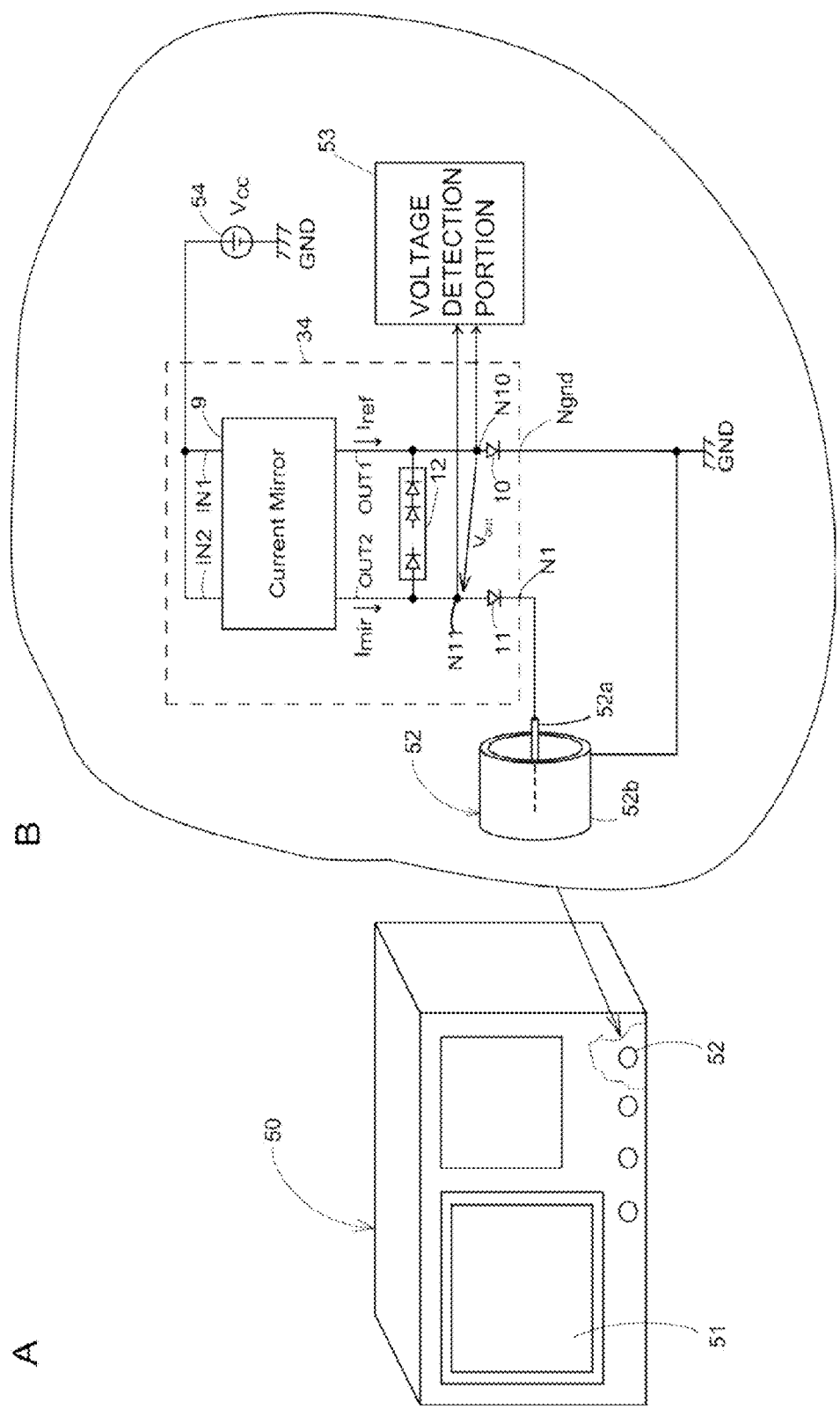
FIG. 10 shows an outline of an oscilloscope (part A) and a circuit block diagram showing the configuration of the oscilloscope (part B) according to a fifth embodiment of the present invention.

FIG. 10 (part A) shows an outline of an oscilloscope 50 according to the fifth embodiment of the present invention, and FIG. 10 (part B) is a circuit diagram showing a main portion in oscilloscope 50. As shown in FIG. 10 (part A and part B), provided on the front surface of oscilloscope 50 are a screen 51 displaying waveforms of detected signals, an input terminal 52 allowing signals to be input, and the like. Input terminal 52 is of a coaxial type and includes a central conductor 52a and an outer conductor 52b.

Central conductor 52a of input terminal 52 is connected to input node N1 of the built-in voltage clamp circuit 34, and output nodes N10 and N11 of voltage clamp circuit 34 are connected to a voltage detection portion 53. Compared to FIG. 1, voltage clamp circuit 34 of FIG. 10 (part B) differs from voltage clamp circuit 7 of FIG. 1 in that DC power supply 8 (FIG. 1) is a DC power supply 54 being provided by oscilloscope 50. Input-power terminals IN1 and IN2 are also connected to this DC power supply 54. Ground node $N_{GND}$ and outer conductor 52b are connected to a line of ground voltage GND.

A voltage that has been input to input terminal 52 is provided via voltage clamp circuit 34 to voltage detection portion 53. The voltage input to voltage detection portion 53 is limited to at most clamping voltage $V_c$ by voltage clamp circuit 34. Voltage detection portion 53 detects the voltage input via voltage clamp circuit 34 and displays waveforms of the detected voltage on screen 51.

Note that voltage clamp circuit 34 may be replaced by voltage clamp circuit 23 of FIG. 4 and may also be replaced by voltage clamp circuit 25 of FIG. 5. Note that also here the DC-voltage source 8 is a DC power supply 54 being provided by oscilloscope 50.

Note that it may be considered that in the semiconductor evaluation device shown in FIG. 1, FIG. 4 and FIG. 5 the voltage clamp circuits 7, 23 and 25 respectively and differential voltage measurement probe 13 are removed, oscilloscope 14 is replaced by oscilloscope 50 having voltage clamp circuit 34 built therein, and the drain of semiconductor switching element 1 is connected to input terminal 52 of oscilloscope 50.

Further, oscilloscope 50 having voltage clamp circuit 34 built therein, pulse generating circuit 2 and a controller for controlling DC power supplies 4 (FIG. 1) may be provided to allow the characteristics of semiconductor switching element 1 to be automatically measured.

Although the present invention has been described and illustrated in detail, it is clearly understood that the same is by way of illustration and example only and is not to be taken by way of limitation, the scope of the present invention being interpreted by terms of the appended claims.

Examples

In FIG. 15a to FIG. 15c, FIG. 16a to FIG. 16c and FIG. 17a to FIG. 17c, three simulations of three different semiconductor evaluation devices are provided to demonstrate the advantages of the present invention compared to the prior art. The simulations show the voltage waveforms of $V_{in}$ and $V_{out}$ as explained in the first embodiment. The resistance value of the load-resistance element is 10Ω and the output voltage of the DC power supply is 100V. The switching frequency of the semiconductor switching element (IPW60R099C6) is 500 kHz and its duty cycle is 50%. The gate drive conditions of the semiconductor switching element are kept the same in the three simulations. The gate is driven, via a resistor of 1Ω, by a trapezoidal voltage waveform, assuming the values 0 V and 10 V with a frequency of 500 kHz, duty cycle of 50% and rise and fall times of 10 nanoseconds.

Figure 11:
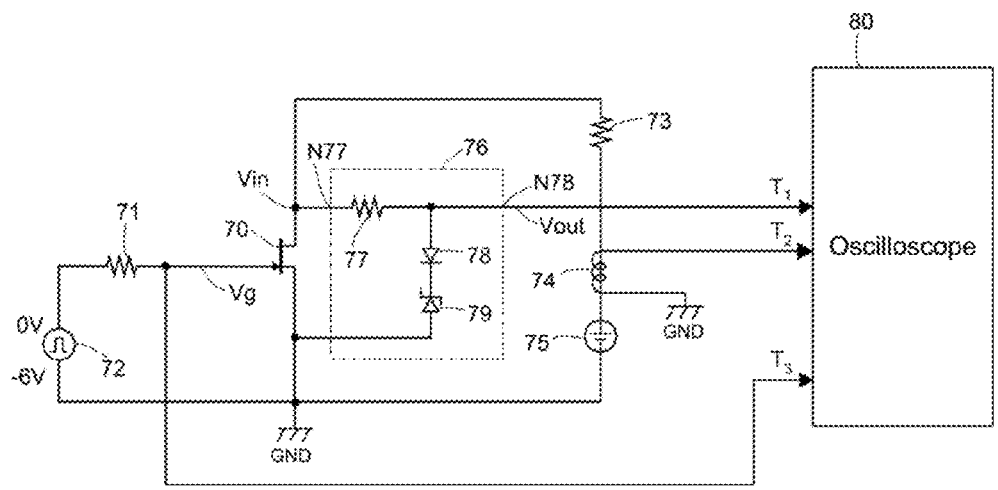
FIG. 11 is a circuit block diagram showing a configuration of a first prior art semiconductor evaluation device.
Figure 12:
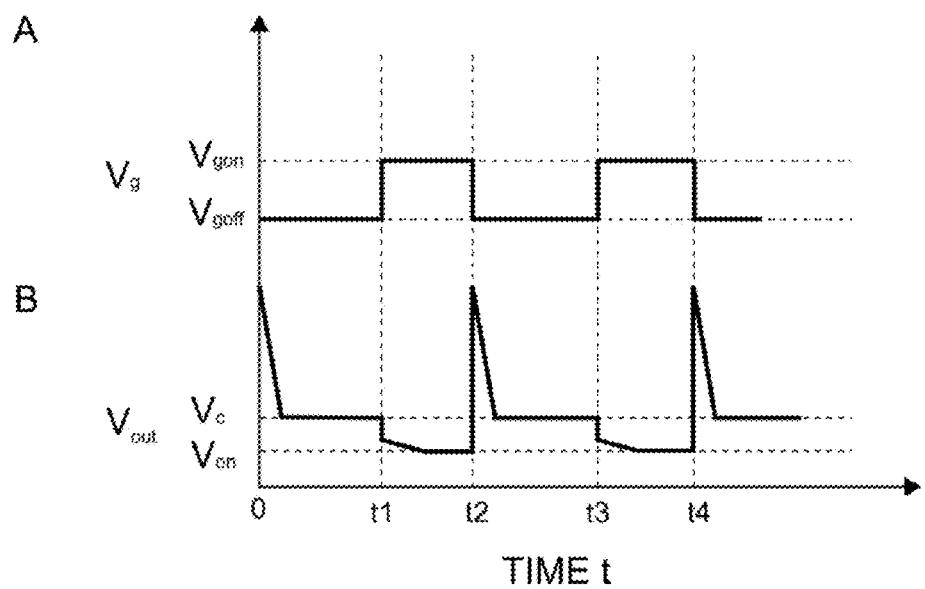
FIG. 12 is a time chart showing operations of the gate voltage (part A) of the semiconductor device to be evaluated in the semiconductor evaluation device shown in FIG. 11 and a time chart showing operations of the output voltage (part B) of the semiconductor evaluation device shown in FIG. 11.

In the first simulation (FIG. 15a to FIG. 15c, prior art according to FIG. 11), the voltage clamp circuit includes a resistive element (1000 kΩ), a diode (BAV3004W) and a Zener diode (BZX84C2V7). There has been a time delay problem. If gate voltage $V_g$ is raised from low voltage $V_{goff}$ to high voltage $V_{gon}$, output voltage $V_{out}$ is gradually decreased to on-state voltage $V_{on}$ because of time delay due to the RC time constant. Thus, there has been a problem in that during high-speed operations the characteristics of the semiconductor switching element cannot be accurately evaluated.

Figure 13:
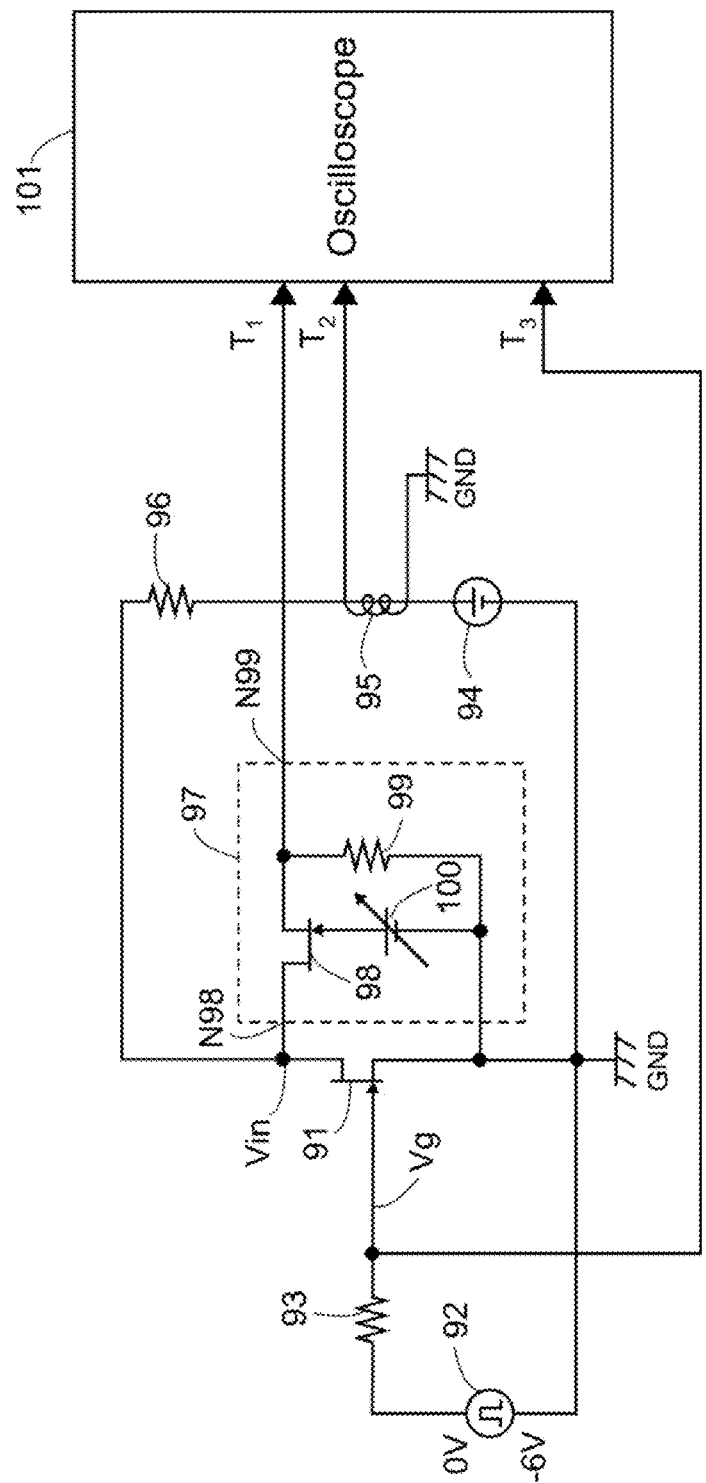
FIG. 13 is a circuit block diagram showing a configuration of a second prior art semiconductor evaluation device.
Figure 14:
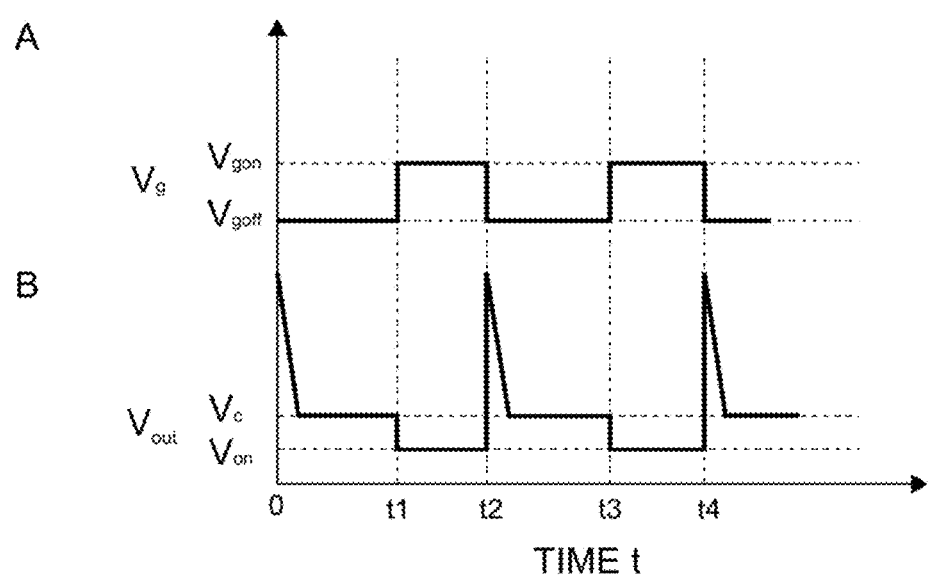
FIG. 14 is a time chart showing operations of the gate voltage (part A) of a semiconductor device to be evaluated in the semiconductor evaluation device shown in FIG. 13 and a time chart showing operations of the output voltage (part B) of the semiconductor evaluation device shown in FIG. 13.
Figure 15A:
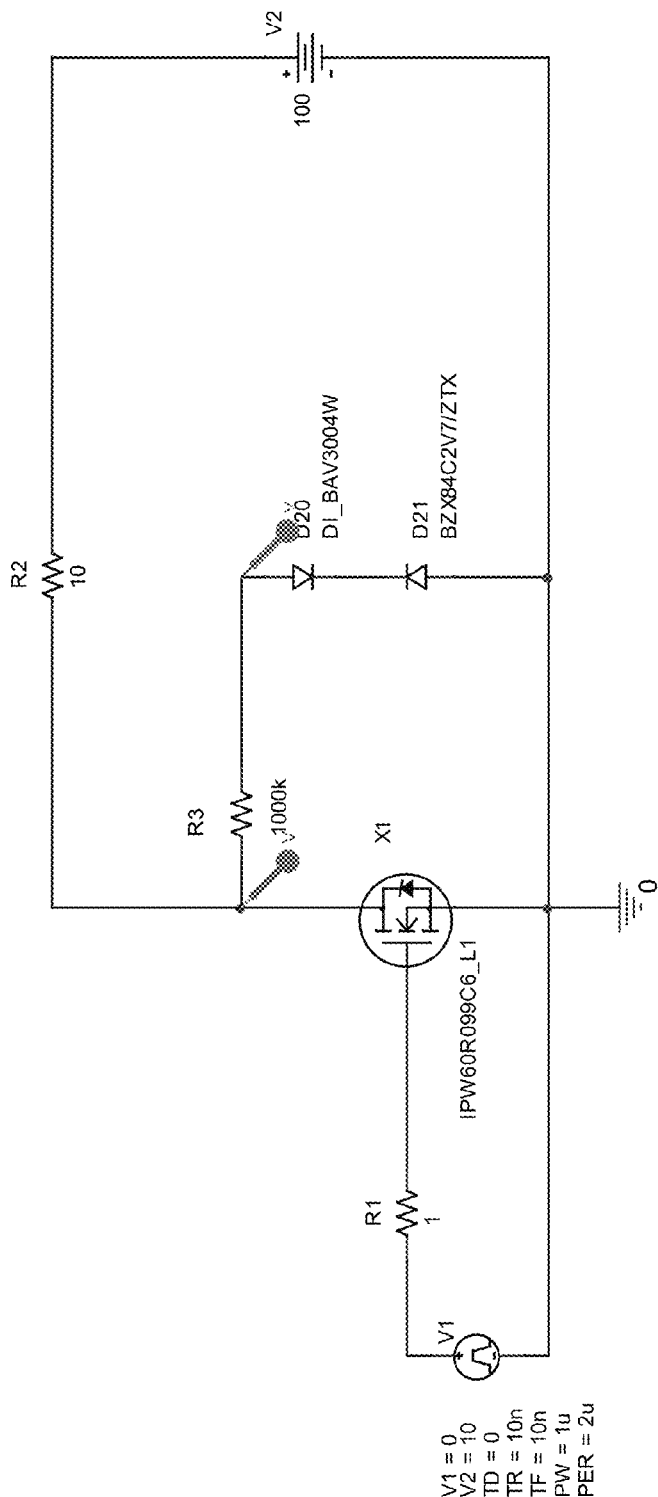
FIG. 15a to FIG. 15c show a simulation using a circuit according to prior art as shown in FIG. 11.
Figure 15B:
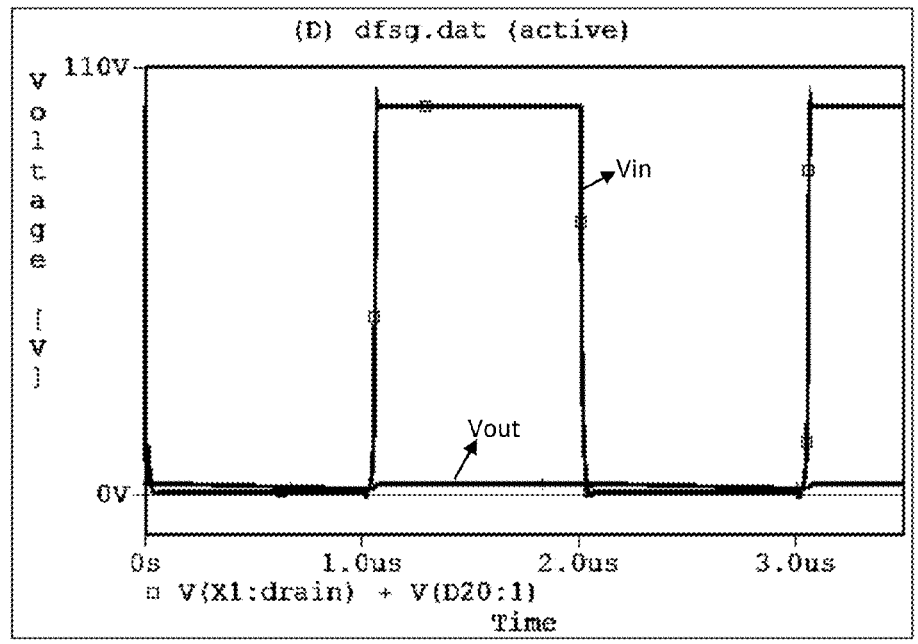
Figure 15C:
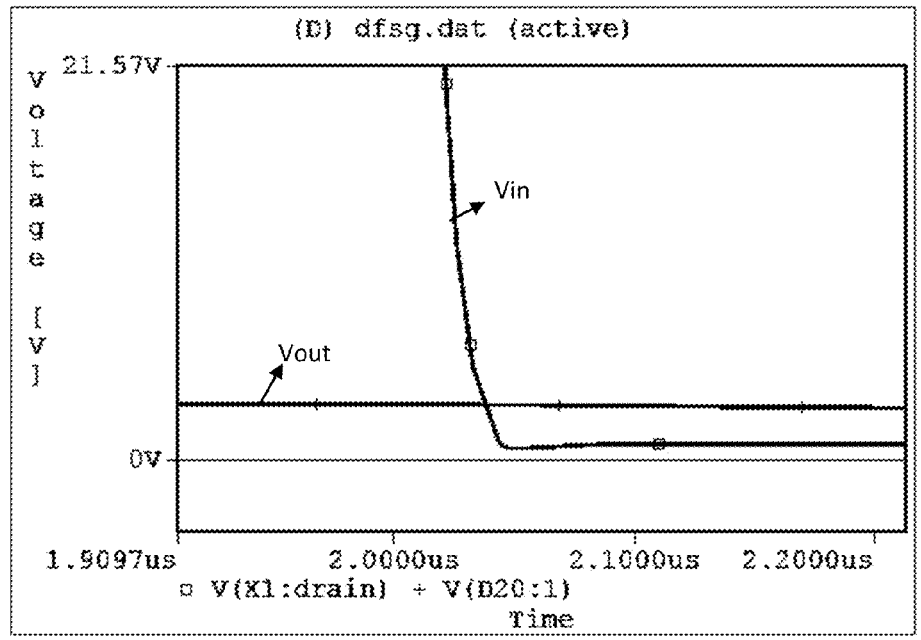
Figure 16A:
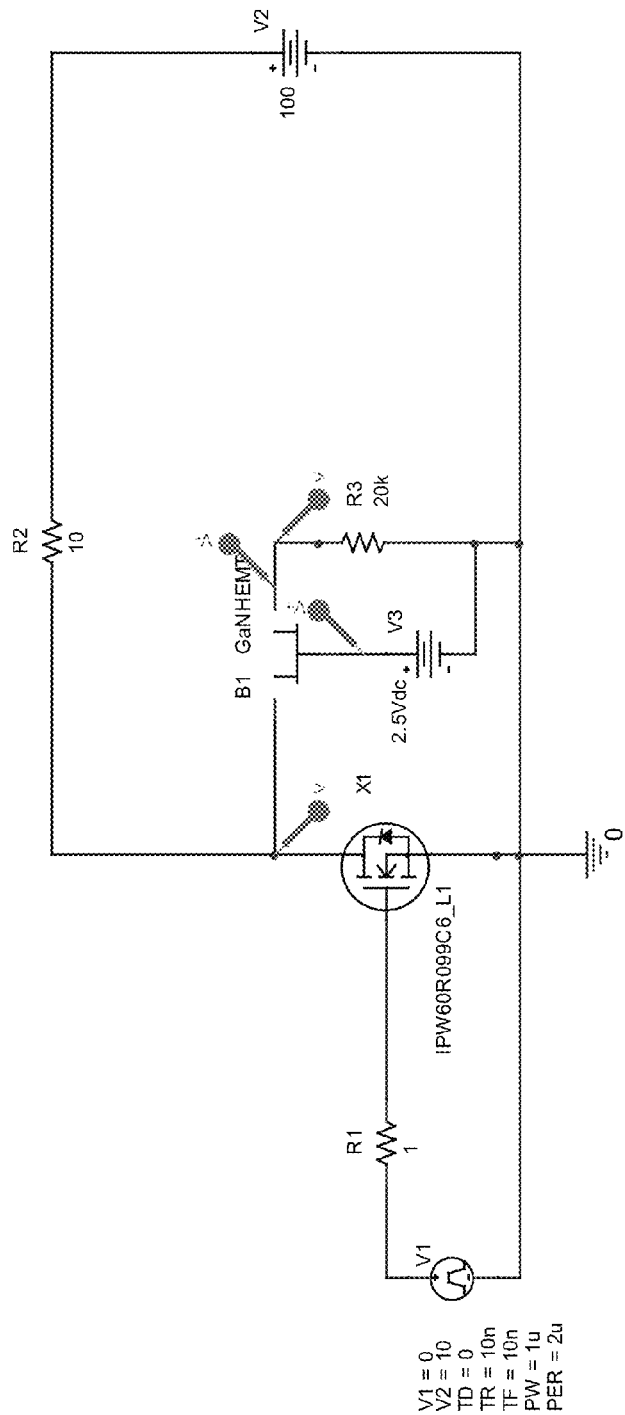
FIG. 16a to FIG. 16c show a simulation using a circuit according to prior art as shown in FIG. 13.
Figure 16B:
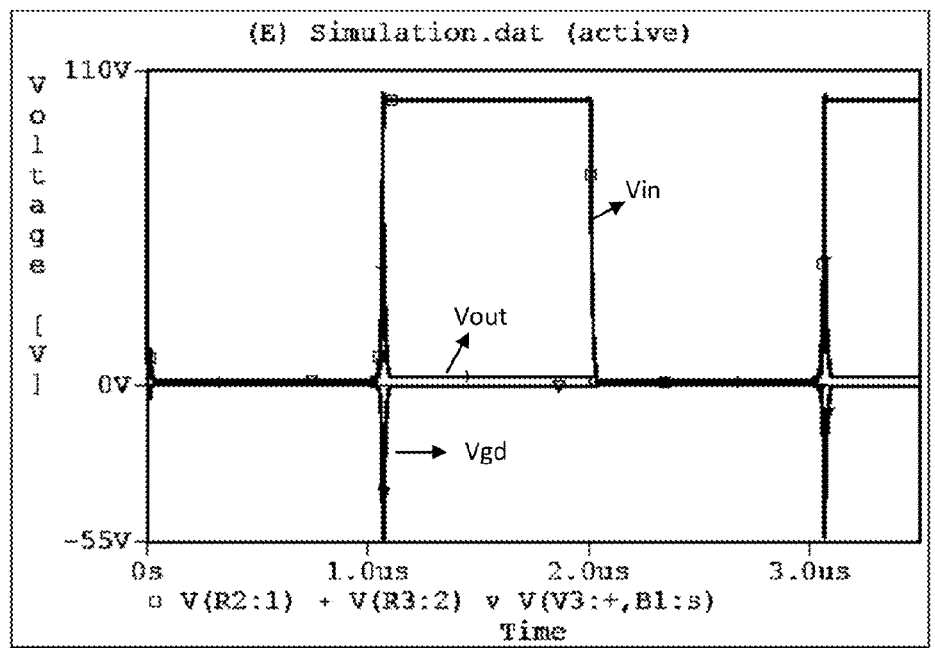
Figure 16C:
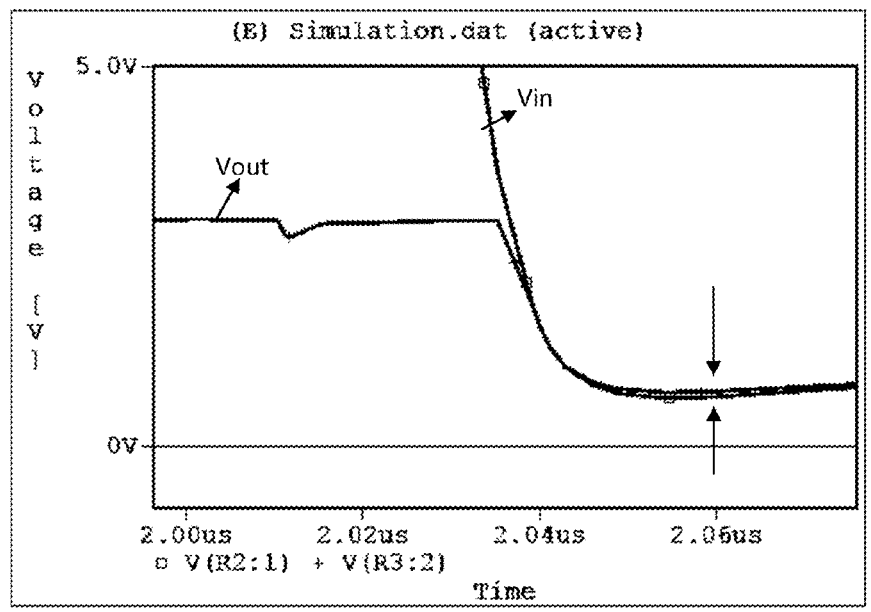
Figure 17A:
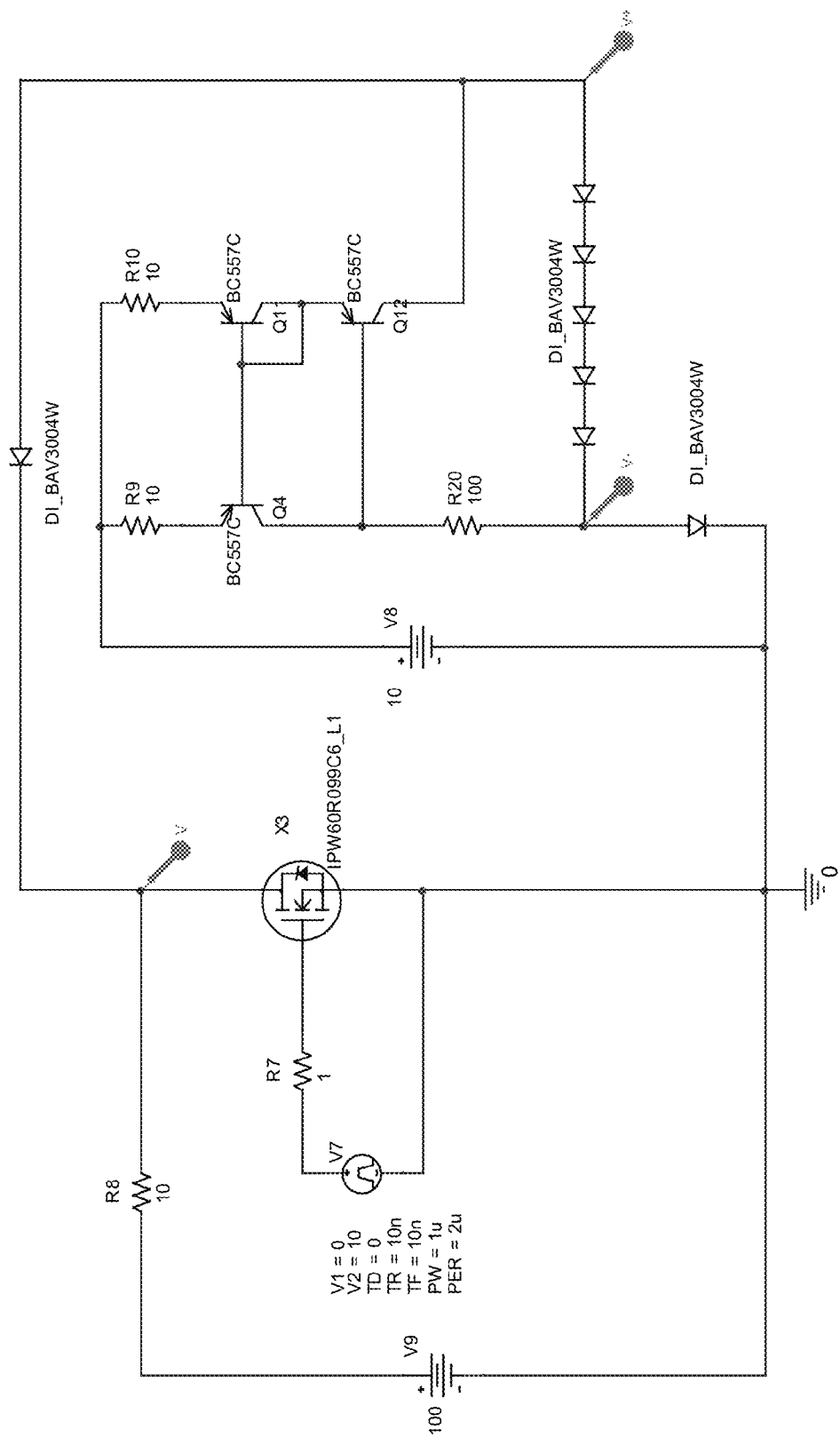
FIG. 17a to FIG. 17c show a simulation using a circuit according to an embodiment of the present invention.
Figure 17B:
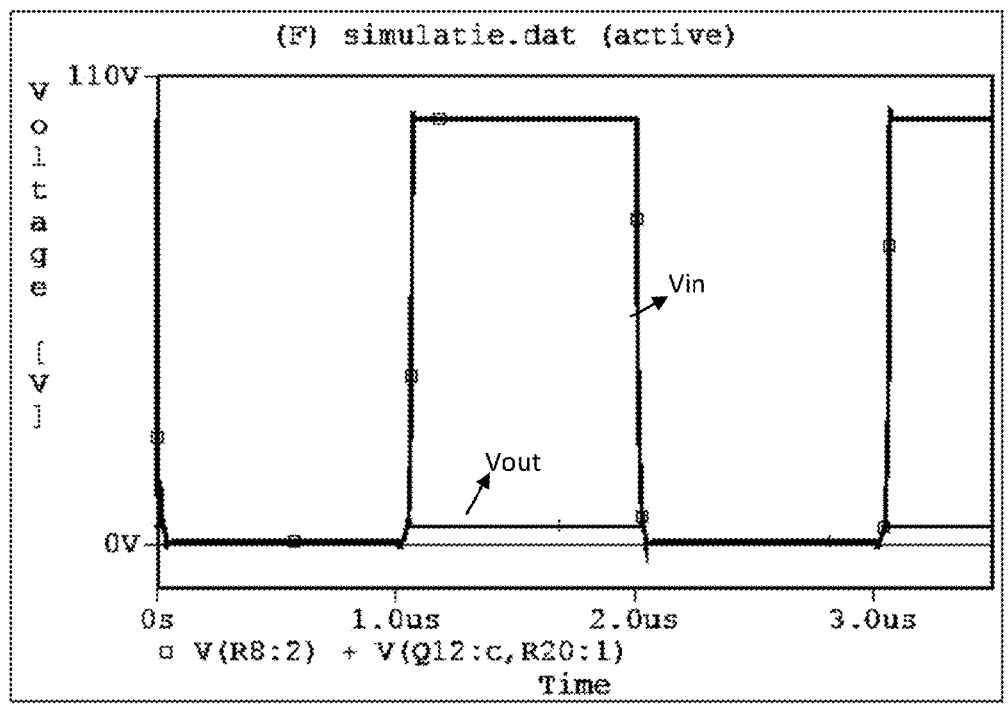
Figure 17C:
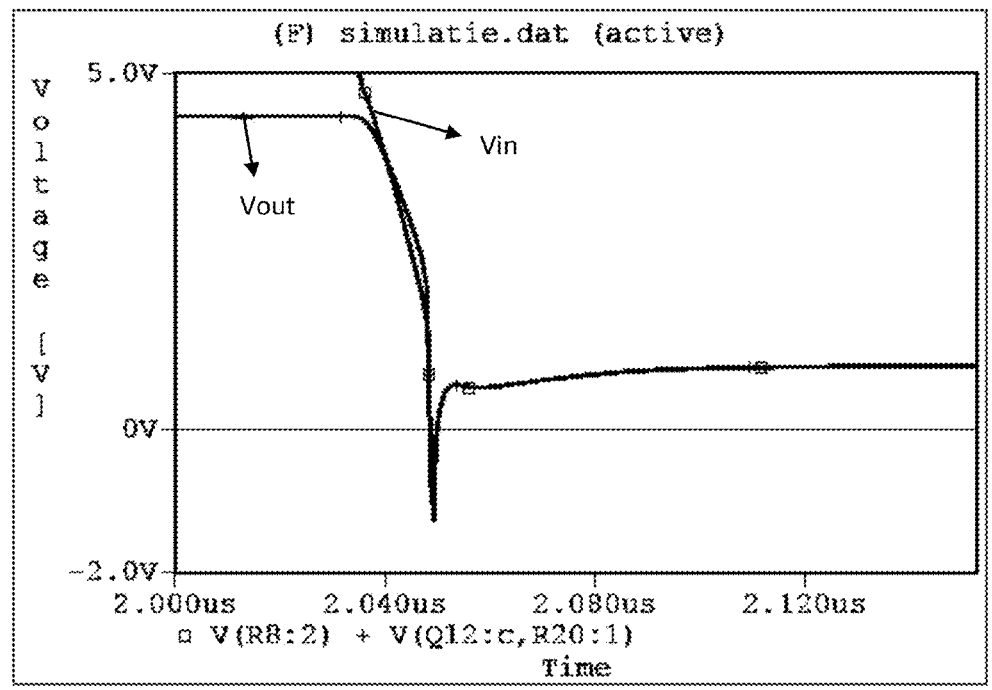

In the second simulation (FIG. 16a to FIG. 16c, prior art according to FIG. 13), the voltage clamp circuit includes a normally-on type field-effect transistor (made from gallium nitride), a resistance element (20 kΩ) and a DC power supply of which the output voltage can be adjusted and is set at 2.5 V. There has been a saturation problem, a overvoltage problem, and a measurement error problem. If the drain-voltage of the semiconductor switching element (IPW60R099C6) rises, output voltage $V_{out}$ is increased above $V_c$ due to the parasitic drain-to-source capacitance of the normally-on type field-effect transistor in combination with the relatively high value of the resistance element. This peak voltage can be several times the clamping voltage $V_c$, distorting the characteristics of an amplifier inside the oscilloscope, resulting in failure to accurately measure the voltage waveforms. In addition, the rise of output voltage $V_{out}$ will cause the gate-to-source voltage $V_{gs}$ of the normally-on type field-effect transistor to become more negative than allowed. This will destroy the normally-on type field-effect transistor. Also during the on-state of the semiconductor switching element, a small current flows through the normally-on type field-effect transistor causing a voltage drop across this transistor. This will introduce an error on the measurement.

In the third simulation (FIG. 17a to FIG. 17c, according to the present invention), the voltage clamp circuit includes two high-voltage diodes (BAV3004W), a Wilson current mirror circuit built from three resistors (10, 10 and 100Ω) and three BC557C pnp-transistors, a direct current voltage source of 10 V, and a series connection of five clamping diodes (BAV3004W). The voltage clamp circuit does not affect the operation speed during the switching transitions of the semiconductor element (IPW60R099C6), allowing the voltage clamp circuit to operate at high speed. The reason for this is that the voltage clamp circuit inherently keeps current equilibrium. There is no delay caused by a RC time constant and there aren't any problems with parasitic coupling elements, keeping the voltage clearly within the desired range, even during state transitions of the semiconductor switching element.

According to some embodiments of the present invention, the working mechanism of the voltage clamp circuit may be based on the following principles, embodiments of the present invention not being limited thereto. In some embodiments two equal (or equal within a small tolerance) currents (mirror currents) are sent through two high voltage diodes during the on-state of the semiconductor switching device to be characterized, projecting the on-state voltage of the semiconductor switching device between the two output nodes of the clamping circuit. These two mirror currents can for example advantageously be generated by a current mirror circuit. The voltage between the two output nodes is equal (or equal within a small tolerance) to the on-state voltage of the semiconductor switching device since the two mirror currents introduce two equal (or equal within a small tolerance) voltage drops across two diodes, e.g. two high-voltage diodes. For these voltage drops to be equal (or equal within a small tolerance), the diodes used, e.g. high-voltage diodes must have the same (or same within a small tolerance) I-V characteristics. During the off-state of the semiconductor switching device, one of the two high-voltage diodes is reverse biased, forcing one of the two mirror currents to flow through a series of clamping diodes. Thereby the output voltage is clamped to a voltage determined by the voltage drops across the clamping diodes, the voltage of the current sinking node and the voltage drop across the high-voltage diode that is still conducting. An alternative way of achieving the on-state voltage drop of the semiconductor switching device to be characterized is to send two unequal currents (here also called the mirror currents) through the two high-voltage diodes during the on-state of the semiconductor switching device. Now the voltage between the output nodes is unequal to the on-state voltage drop. This is also the case when the two high-voltage diodes have different I-V characteristics. However, when the I-V characteristics of the two high-voltage diodes are known, as also the two mirror currents, the difference between the output voltage and the on-state voltage drop can be determined. This makes it also possible to determine the on-state voltage drop. This method (or similar methods) of determining the on-state voltage drop also belongs to the subject of the present invention. According to the previous paragraph, an inequality of the output voltage and the on-state voltage drop of the semiconductor switching device, during its on-state, can occur when, e.g., the mirror currents are unequal, and/or the I-V characteristics of the high-voltage diodes are different from each other. This inequality could be taken into account in the determination of the on-state voltage drop if knowing the inequalities. If the inequalities are not known, the on-state voltage drop of the semiconductor switching device cannot be determined exactly, resulting in a measurement error. It is recommended that this error should not be higher than 20%. However, the accuracy of the present invention can be much higher, as shown by the following example: current mirrors typically can have a very high current accuracy of ±0.5% (see for example the REF200 current mirror from Texas Instruments). When the mirror currents have for example a nominal value of 60 mA, this means that in the worst case situation, the real mirror currents are 60.3 A and 59.7 A. When, for example, using two BAV21 high-voltage diodes this will result in difference between the voltage drops across both diodes of less than 0.005 V. When the on-state voltage of the semiconductor switching device that has to be characterized is for example 1V, this means that the measurement error is 0.5% at maximum.

In one aspect, the present invention also relates to a method for reflecting a voltage at an input node, the method comprising providing a voltage clamp circuit comprising a circuit (9) for providing at least two currents ($I_{mir}$, $I_{ref}$) at its output terminals, at least two diodes each being connected to an output terminal of the circuit for providing at least two currents and further being connected to a ground voltage and the input node respectively, and a series connection of one or more clamping diodes connected to an output terminal of the circuit for providing at least two currents and to a current sinking node. The method also comprises determining the voltage whereby the voltage at the input node is reflected by the voltage between two output nodes when the voltage at the input node is lower than a clamping voltage and for fixing a voltage between the two output nodes to the clamping voltage when the voltage at the input node is higher than the clamping voltage. Further method steps may be expressed by the functionality of the different components described in embodiments of the first aspect. The present invention also relates to the use of a voltage clamp circuit for voltage clamping, use in a semiconductor device, use for over current protecting, use for voltage measuring or use for evaluating a semiconductor device.

The invention claimed is:

1. A voltage clamp circuit for reflecting a voltage at an input node, the voltage clamp circuit comprising:
   a circuit for providing at least two currents at its output terminals, at least two diodes each being connected to one of the output terminals of the circuit, and further being connected to a line of a ground voltage and the input node respectively, and
   an alternative current path connected to one of the output terminals of the circuit and to a current sinking node, so that the voltage at the input node is reflected as the voltage between two output nodes when the voltage at the input node is lower than a clamping voltage and so that the voltage between the two output nodes is fixed to the clamping voltage when the voltage at the input node is higher than the clamping voltage.

2. The voltage clamp circuit according to claim 1, wherein the circuit providing at least two currents is a current mirror circuit.

3. The voltage clamp circuit according to claim 2, wherein the circuit for providing two currents comprises a direct-current power supply, wherein the direct-current power supply includes a positive terminal connected to input terminals of the current mirror circuit and a negative terminal connected to the line of ground voltage GND, the current mirror circuit being connected with its input terminals to the positive terminal of the direct-current power supply.

4. The voltage clamp circuit according to claim 2, wherein the current mirror circuit provides two equal currents at its output terminals.

5. The voltage clamp circuit according to claim 1, wherein the at least two diodes are high-voltage diodes.

6. The voltage clamp circuit according to claim 1, wherein the alternative current path comprises a series connection of one or more clamping diodes.

7. The voltage clamp circuit according to claim 6, wherein the series connection of one or more clamping diodes is a series connection of one or more clamping diodes having a cathode connected to an anode of their neighbor and an anode connected to a cathode of their neighbor and wherein an anode of a first clamping diode is connected to an anode of one of the two diodes and a cathode of a last clamping diode is connected to a current sinking node.

8. The voltage clamp circuit according to claim 6, wherein the clamping voltage is a voltage of the sum of the forward voltage drops across the in series connected clamping diodes when they are in conduction mode, added by a voltage of the sinking node minus the forward voltage drop across a first diode of the at least two diodes during the conduction mode of the clamping diodes.

9. The voltage clamp circuit according to claim 6, wherein one or more of the diodes of the series connection of clamping diodes are Zener diodes, and wherein the Zener diodes are reversely placed.

10. The voltage clamp circuit according to claim 6, wherein all or some of the diodes are transistors, used as diodes.

11. The voltage clamp circuit according to claim 1, wherein the current sinking node is the anode of a first diode of the two diodes and wherein the voltage of the sinking node during a conduction mode of the alternative current path, is the forward voltage drop across the first diode.

12. The voltage clamp circuit according to claim 1, wherein the current sinking node is the line of ground voltage GND and wherein the voltage of the sinking node is zero.

13. The voltage clamp circuit according to claim 1, wherein the forward voltage drops across the at least two diodes are as equal as possible when the at least two diodes carry equal currents.

14. The voltage clamp circuit according to claim 1, wherein all or some of the diodes are transistors, used as diodes.

15. The semiconductor device comprising the voltage clamp circuit according to claim 1 and a semiconductor switching element, wherein the input node is provided with a voltage between terminals of the semiconductor switching element.

16. An overcurrent protection circuit comprising the voltage clamp circuit recited in claim 1, wherein the input node is provided with a voltage between terminals of a semiconductor switching element to be protected, and the overcurrent protection circuit further comprises a controller and a driver that turn off the semiconductor switching element when the voltage between the output nodes exceeds a predetermined voltage.

17. A voltage measurement probe comprising the voltage clamp circuit recited in claim 1, and a probe head in contact with a measurement point and electrically connected to the input node.

18. A voltage measurement device comprising the voltage clamp circuit recited in claim 1, wherein a voltage at a measurement point that is connected with the input node is measured from the output nodes.

19. A semiconductor evaluation device comprising the voltage measurement device recited in claim 18, a direct-current power supply for providing a direct-current voltage between terminals of a semiconductor switching element to be evaluated, and a pulse generating circuit turning on and off the semiconductor switching element, wherein the voltage measurement device is adapted for measuring, from the output nodes, a voltage between terminals of the semiconductor switching element provided to the input node.

* * * * *